US012593551B2

(12) United States Patent
Lee et al.

(10) Patent No.: US 12,593,551 B2
(45) Date of Patent: Mar. 31, 2026

(54) DISPLAY DEVICE USING MICRO LED AND MODULAR DISPLAY DEVICE USING SAME

(71) Applicant: LG ELECTRONICS INC., Seoul (KR)

(72) Inventors: Sungguk Lee, Seoul (KR); Dohyung Lee, Seoul (KR); Sangdae Park, Seoul (KR); Hwankuk Yuh, Seoul (KR); Jaegwang Um, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 370 days.

(21) Appl. No.: 18/027,558

(22) PCT Filed: Sep. 22, 2020

(86) PCT No.: PCT/KR2020/012759
§ 371 (c)(1),
(2) Date: Mar. 21, 2023

(87) PCT Pub. No.: WO2022/065526
PCT Pub. Date: Mar. 31, 2022

(65) Prior Publication Data
US 2023/0268476 A1    Aug. 24, 2023

(51) Int. Cl.
*H10H 20/857*    (2025.01)
*H10D 86/40*    (2025.01)
(Continued)

(52) U.S. Cl.
CPC ........ *H10H 20/857* (2025.01); *H10D 86/441* (2025.01); *H10D 86/60* (2025.01); *H10H 20/8312* (2025.01); *H10W 90/00* (2026.01)

(58) Field of Classification Search
CPC ............. H10H 20/857; H10H 20/8312; H10H 20/8314; H10H 20/8316; H01L 25/167; H01L 25/0753; H05K 1/117; H05K 3/403
See application file for complete search history.

(56) References Cited

U.S. PATENT DOCUMENTS 11,144,094 B2 *   10/2021   Jeong .................... G06F 1/1637
11,881,473 B2 *   1/2024   Lee ........................ H10H 20/01
(Continued)

FOREIGN PATENT DOCUMENTS

KR   10-2017-0135468 A   12/2017
KR   10-2019-0068112 A   6/2019
(Continued)

OTHER PUBLICATIONS

English Machine Translation of KR-20190068112-A (Year: 2019).*

*Primary Examiner* — Yara B Green
*Assistant Examiner* — Erika H Son
(74) *Attorney, Agent, or Firm* — Birch, Stewart, Kolasch & Birch, LLP

(57) ABSTRACT

The present invention can be applied to a technical field regarding a display device, and relates to, for example, a display device using a micro light emitting diode (LED) and a modular display device using same. The display device of the present invention may comprise: a first substrate comprising a first electrode located on a first surface and a second electrode located on a second surface which is an opposite surface to the first surface; a second substrate located on the first substrate and comprising a connection wire that defines multiple individual pixel regions, the second substrate being located on the first substrate so as to have an exposure portion exposing at least a portion of the first electrode on the first substrate; a connection electrode which contacts the exposure portion through the side surface of the second substrate to connect the first electrode of the first substrate to the connection wire of the second substrate; and a light emitting device connected to the connection wire of the second substrate.

13 Claims, 21 Drawing Sheets

(51) Int. Cl.
    *H10D 86/60*      (2025.01)
    *H10H 20/831*    (2025.01)
    *H10W 90/00*    (2026.01)

(56)            References Cited

U.S. PATENT DOCUMENTS

| | | | |
|---|---|---|---|
| 2008/0137166 A1* | 6/2008 | Sah | H05K 1/16 |
| | | | 345/55 |
| 2020/0142241 A1* | 5/2020 | Jing | G02F 1/133514 |
| 2020/0259056 A1* | 8/2020 | Hong | H10H 29/49 |
| 2020/0303608 A1* | 9/2020 | Song | H05K 3/403 |
| 2022/0085099 A1* | 3/2022 | Son | H10D 89/921 |

FOREIGN PATENT DOCUMENTS

| | | | | |
|---|---|---|---|---|
| KR | 20190068112 A | * | 6/2019 | H10K 50/84 |
| KR | 10-2067090 B1 | | 1/2020 | |
| KR | 10-2020-0099066 A | | 8/2020 | |

* cited by examiner

DISPLAY DEVICE USING MICRO LED AND MODULAR DISPLAY DEVICE USING SAME

CROSS REFERENCE TO RELATED APPLICATION

This application is the National Phase of PCT International Application No. PCT/KR2020/012759, filed on Sep. 22, 2020, which is hereby expressly incorporated by reference into the present application.

TECHNICAL FIELD

The present disclosure applicable to a technical field related to a display device relates to, for example, a display device using a micro light emitting diode (LED) and a modular display device using the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

For a display employing semiconductor light emitting elements, the semiconductor light emitting elements corresponding to individual pixels are required to be connected to a substrate. Accordingly, it may be relatively difficult to implement a high definition large-screen display.

In this regard, a large-area display device may be implemented by combining various displays as modules. In this case, the bezel area, which is an edge area of the display, may be required to be reduced. The technology used for this purpose is called zero bezel technology.

Basically, in implementing the zero bezel technology, substrates and electrodes are likely to be damaged when exposed to an external impact and stimulation. In addition, it is difficult to implement a zero bezel with a narrow pitch.

Methods for implementing such a zero bezel technology may be divided into printing upper and lower wires on a side surface with a conductive material and bending a flexible substrate rearward.

First, according to the former method of printing upper and lower wires on a side surface with a conductive material, a glass substrate is used and the side surface is processed. Accordingly, the glass is very likely to be damaged even by a small external impact applied during installation or handling of the substrate.

In addition, since the vertical connection wire is on the side surface, the electrode may be damaged by external contact, resulting in increase in resistance or disconnection.

According to the latter method of bending a flexible substrate rearward, when a wire connector is bent, an internal electrode may be damaged, resulting in increase in resistance or disconnection.

In addition, due to the thickness of the flexible substrate, the electrode, the radius of curvature has a certain limit. Accordingly, and the protective layer, it is difficult to implement a zero bezel with a narrow pitch and to uniformly bend the substrate of a large area.

Therefore, there is a need for a method to address the issues related to the conventional zero bezel technology.

DISCLOSURE

Technical Problem

An object of the present disclosure devised to address the problems is to provide a display device using a micro LED capable of implementing a narrow bezel area and a modular display device using the same.

Another object of the present disclosure is to provide a display device using a micro LED capable of preventing damage to substrates and electrodes in implementing the display device, and a modular display device using the same.

Another object of the present disclosure is to provide a display device using a micro LED capable of implementing a space-efficient and design-efficient high-resolution zero-bezel display and thus allowing a large-area high-resolution zero-bezel display to be manufactured, and a modular display device using the same.

Another object of the present disclosure is to provide a display device using a micro LED capable of improving reliability and quality of the display device by enabling efficient wiring and preventing damage to electrodes and substrates, and a modular display device using the same.

Technical Solution

In one aspect of the present disclosure to achieve the objects of the present disclosure, a display device may include a first substrate including a first electrode disposed on a first surface and a second electrode disposed on a second surface opposite to the first surface, a second substrate disposed on the first substrate and including a connection wire defining a plurality of individual pixel regions, the second substrate having an exposure portion exposing at least a portion of the first electrode of the first substrate, a connection electrode contacting the exposed portion through a side surface of the second substrate to connect the first electrode of the first substrate and the connection wire of the second substrate, and a light emitting element connected to the connection wire of the second substrate.

The first substrate may be a printed circuit board (PCB), wherein the first electrode and the second electrode may be electrodes printed on the PCB.

The second substrate may be a thin film transistor (TFT) substrate having a TFT provided in the pixel regions.

The TFT may have a drain electrode connected to the connection wire.

The display device may further include a third electrode connecting the first electrode to the second electrode.

The third electrode may connect the first electrode to the second electrode through the first substrate.

The exposure portion may be disposed at an end portion of the second substrate.

The exposure portion may be disposed by exposing an edge side of the first substrate by the end portion of the second substrate.

The first electrode of the first substrate may be disposed between the first substrate and the second substrate, wherein the exposure portion may be exposed between the first substrate and the second substrate.

The connection electrode may include a protrusion disposed on the connection wire of the second substrate.

The first surface may be positioned inside the first substrate, wherein the first electrode may be disposed between a top surface of the first substrate and the first surface.

A width of the second substrate may be substantially equal to a width of the first substrate.

In another aspect of the present disclosure, provided herein is a modular display device having at least two display modules combined. The module may include a first substrate including a first electrode disposed on a first surface and a second electrode electrically connected to the first electrode and disposed on a second surface opposite to the first surface, a second substrate disposed on the first substrate and including a connection wire defining a plurality of individual pixel regions, the second substrate having an exposure portion exposing at least a portion of the first electrode of the first substrate, a connection electrode contacting the exposed portion through a side surface of the second substrate to connect the first electrode of the first substrate and the connection wire of the second substrate, and a light emitting element connected to the connection wire of the second substrate.

The display module may further include a flattened layer disposed on the second substrate, and a protective layer disposed at an edge side of the first substrate and at an end portion of the flattened layer.

The at least two modules arranged adjacent to each other to have the above configuration may be bonded.

The protective layers of the two adjacent modules may be arranged to contact.

ADVANTAGEOUS EFFECTS

According to an embodiment of the present disclosure, the following effects may be provided.

First, according to an embodiment of the present disclosure, damage to a substrate and electrodes may be prevented when a display device is implemented.

In addition, when a high-resolution display device having pixels of a narrow pitch is manufactured, a connection electrode may be locally configured using an exposure portion, thereby enabling a narrow bezel display, a so-called zero bezel display to be effectively manufactured. In addition, a space-efficient and design-efficient high-resolution display may be implemented. Therefore, a large-area high-resolution zero-bezel display may be manufactured.

As described above, efficient wire connection may be implemented and damage to the electrodes and the substrates may be prevented. Accordingly, the reliability and quality of the display device may be improved.

Furthermore, according to another embodiment of the present disclosure, additional advantageous and advantageous effects not mentioned herein may be understood by those skilled in the art upon examination of the entirety of the specification and drawings.

DESCRIPTION OF DRAWINGS

FIG. 1 is a perspective view showing a display device according to a first embodiment of the present disclosure.

FIGS. 6 to 13 are views illustrating a process of manufacturing the display device according to the first embodiment of the present disclosure.

FIG. 14 is a perspective view showing a display device according to a second embodiment of the present disclosure.

FIG. 21 is a perspective view showing the modular display device according to the second embodiment of the present disclosure.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions.

In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
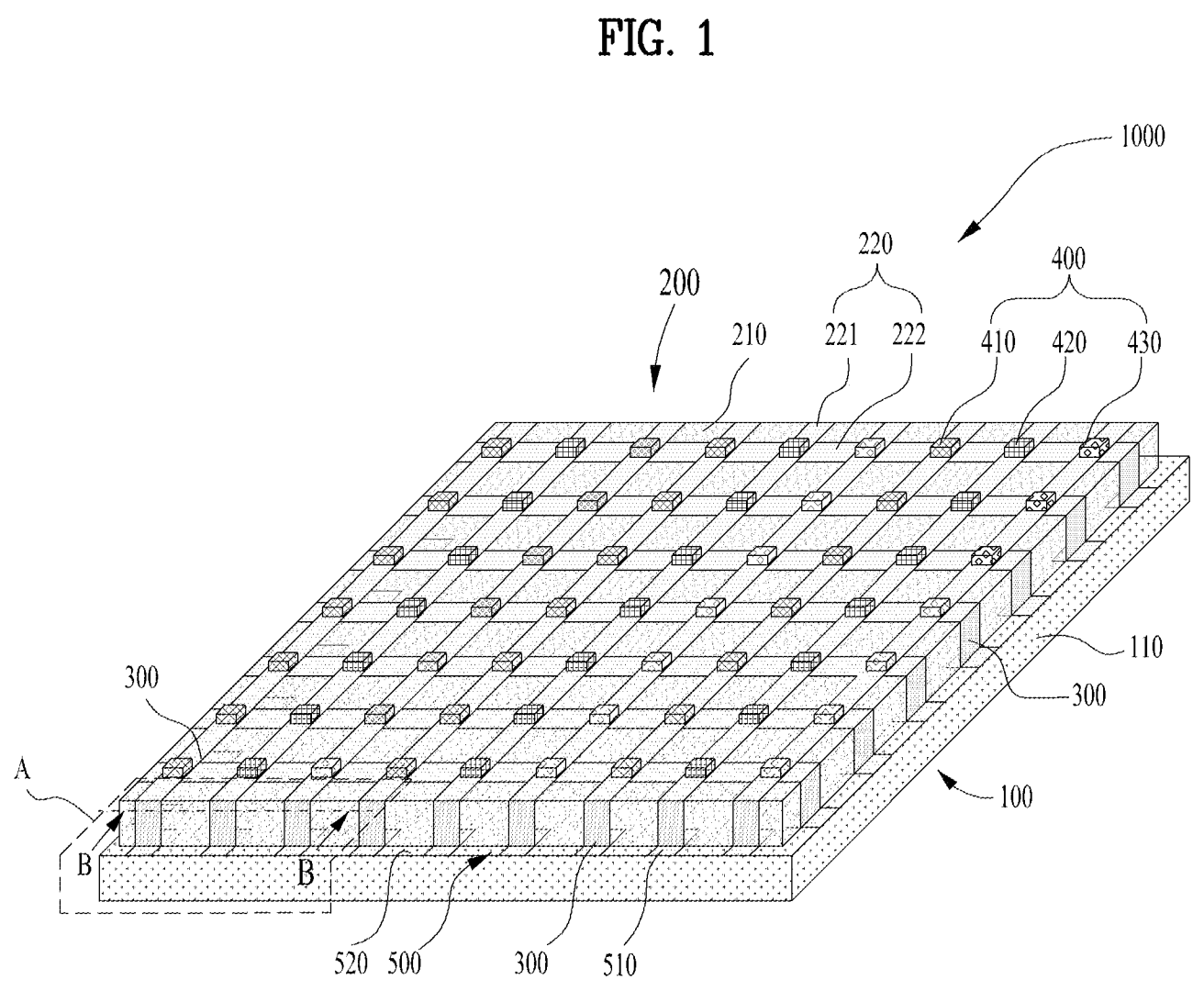
Figure 2:
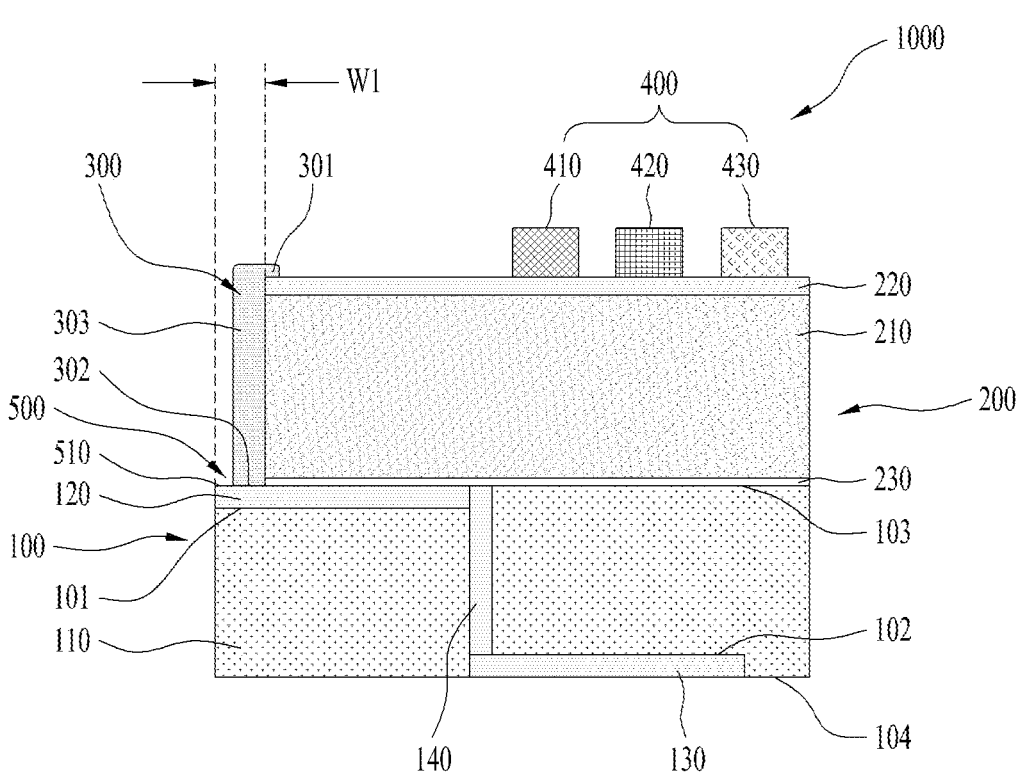
FIG. 2 is a cross-sectional view of part A, taken along line B-B in FIG. 1.

FIG. 1 is a perspective view showing a display device according to a first embodiment of the present disclosure. FIG. 2 is a cross-sectional view of part A, taken along line B-B in FIG. 1.

FIG. 1 is an enlarged view of a configuration of a display device. In FIG. 1, some parts may be omitted or briefly illustrated. The pixel spacing in FIG. 2, may not exactly match that in FIG. 1. For example, in FIG. 2, the pixel spacing may be shown to be narrower than the pixel spacing in FIG. 1. This is intended for efficiency of illustration of the drawings.

Referring to FIGS. 1 and 2, the display device 1000 according to the first embodiment of the present disclosure may include a first substrate 100 including a first electrode 120, a second substrate 200 disposed on the first substrate 100 and including a connection wire 220 defining a plurality of individual pixel regions, a connection electrode 300 connecting the first electrode 120 to the connection wire 220, and a light emitting element 400 connected to the connection wire 200.

The first electrode 120 may be disposed on a first surface 101 positioned on a substrate body 110. The first surface 101 may be at a lower position than a top surface 103 of the substrate body 110. That is, for example, there may be a difference in height between the first surface 101 the top surface 103 as large as the thickness of the first electrode 120. Here, the height may refer to a height configured when the display device is placed in the state of FIGS. 1 and 2. In some cases, other terms such as depth and width may be used in place of height.

A second electrode 130 may be disposed on a second surface 102 of the first substrate 100. The second electrode 130 may be electrically connected to the first electrode 120. The second surface 102 on which the second electrode 130 is disposed may be a surface facing in a direction opposite to the direction in which the first surface 101 faces. The height of the second surface 102 may be greater than that of a bottom surface 104 of the substrate body 110. That is, for example, there may be a difference in height between the second surface 102 and the bottom surface 104 as large as the thickness of the second electrode 130.

The second electrode 130 may be electrically connected to the first electrode 120 by a third electrode 140. The second electrode 130 may correspond to a pad electrode of the display device 1000. For example, the second electrode 130 may be an electrode connected to a driving power unit (not shown) of the display device 1000.

In some cases, the second electrode 130 may be arranged to protrude downward from the bottom surface 104. Accordingly, it may be easily connected to the driving power unit. However, the second electrode 130 is not limited thereto. That is, the outer surface of the second electrode 130 may be at the same height as the bottom surface 104.

The third electrode 140 may be a through electrode arranged through the substrate body 110 to connect the first electrode 120 and the second electrode 130 to each other.

For example, the substrate body 110 may be a printed circuit board (PCB). That is, the first electrode 120 and the second electrode 130 may be electrodes printed on the PCB. The third electrode 140 may be arranged through the PCB.

Referring to FIG. 2, at least a portion of the first electrode 120 may be exposed at an end portion of the first substrate 100. That is, the first electrode 120 may be arranged on the first surface 101 of the substrate body 110 such that an end portion thereof reaches an edge of the substrate body 110. In addition, an opposite end portion of the first electrode 120 may be connected to the third electrode 140.

The third electrode 140 may be arranged to substantially extend through the substrate body 110 in a vertical direction. In addition, one end portion of the second electrode 130 may be connected to the third electrode 140 on the side of the bottom surface 104 of the first substrate 100. In this case, the opposite end portion of the second electrode 130 may face away from the first electrode 120. That is, the second electrode 130 may be arranged to extend by a predetermined length from a point where it is connected to the third electrode 140 toward an opposite side of the edge of the substrate body 110.

The second substrate 200 may be disposed on the top surface 103 of the first substrate 100. The second substrate 200 may be disposed on the first substrate 100 to have an exposure portion 500 that exposes at least a portion of the first electrode 120 of the first substrate 100.

The second substrate 200 may be a substrate for forming a connection wire 220 including a TFT. As an example, the second substrate 200 may have a glass substrate as a base body. That is, connection wires 220 defining multiple individual pixel areas may be provided on the substrate base body 210, which is a glass substrate. Hereinafter, an embodiment of the present disclosure will be described mainly focusing on an example in which a glass substrate is used as the second substrate 200.

In this case, the thickness of the glass substrate may be similar to or the same as that of the first substrate 100. The glass substrate may be suitable to form a connection wire 220 including a TFT.

The second substrate 200 may be attached to the first substrate 100 by an adhesive layer 230. However, in some cases, the second substrate 200 may be directly formed on the first substrate 100.

As shown in FIG. 2, the connection wire 220 defining individual pixel regions may be formed in a grid shape on the substrate base body 210. Here, the individual pixels may substantially mean sub-pixels. For example, three sub-pixels may be grouped to form one pixel. For example, in FIG. 2, three light emitting elements 410, 420, and 430 may be red, green, and blue light emitting elements, respectively. Each of the light emitting elements may constitute a sub-pixel, and the three light emitting elements 410, 420, and 430 may constitute one pixel.

In this case, in FIG. 2, a connection wire 221 (hereinafter, referred to as a first connection wire) arranged in one direction may be a pixel electrode (or a data electrode), and a connection line 222 (hereinafter, referred to as a second connection wire) arranged in another direction may be a common electrode, or vice versa.

As described above, sub-pixels may be defined at points where the first connection wires 221 and the second connection wires 222 cross each other.

When the first connection wire 221 is a pixel electrode (or a data electrode), the first connection wire 221 may include a thin film transistor (TFT). Accordingly, the light emitting elements 410, 420, and 430 may be driven by the switching operation by the TFT. This configuration will be described in more detail below with reference to FIG. 3.

As mentioned above, when the second substrate 200 is disposed on the first substrate 100, the exposure portion 500 allowing at least a portion of the first electrode 120 to be exposed may be disposed. The exposure portion 500 may be disposed at an end portion of the second substrate 200.

For example, the width of the second substrate 200 may be less than that of the first substrate 100. Accordingly, when the second substrate 200 is disposed on the first substrate 100, the first substrate 100 may not be fully covered by the second substrate 200, but may have an exposed portion (W1 in FIG. 2). As described above, the exposure portion 500 may be formed on the portion of the first substrate 100 that is not covered by the second substrate 200.

The exposure portion 500 may include a first exposure portion 510 exposing an end portion of the first electrode 120 and a second exposure portion 520 exposing an end portion of the substrate body 110 of the first substrate 100.

A connection electrode 300 connecting the first electrode 120 of the first substrate 100 to the connection wire 220 of the second substrate may be provided to a portion including the first exposure portion 510.

That is, the connection electrode 300 may contact the first electrode 120 of the first substrate 100 through the exposure portion 500 and electrically connect the first electrode 120 of the first substrate 100 with the connection wire 220 of the second substrate 200.

The connection electrode 300 may electrically connect the connection wire 220 of the first electrode 120 to the second substrate 200 using a conductive material such as Ag, Cu, or Al.

In this case, the connection electrode 300 may contact the exposure portion 500 (first exposure portion 510) by the side surface of the second substrate 200 to electrically connect the first electrode 120 of the first substrate 100 and the connection wire 220 of the substrate 200 to each other.

The electrode may be connected to the connection wire 220 by the side surface of the connection electrode 300. Alternatively, as shown in FIG. 2, the connection electrode 300 may include a protrusion 301 protruding toward the connection wire 220 to contact the top surface of the connection wire 220.

The connection electrode 300 may also include a lower contact portion 302 contacting an upper portion of the first electrode 120 by the first exposure portion 510.

That is, the connection electrode 300 may include the protrusion 301 arranged to contact the top surface of the connection wire 220, the lower contact portion 302 arranged to contact the upper portion of the first electrode 120, and a wiring portion 303 arranged to contact a side surface of the second substrate 200.

In the connection electrode 300, the width of the wiring portion 303 may be substantially equal to the width of the connection wire 220 connected thereto. In addition, the width of the wiring portion 303 may be substantially equal to the width of the upper portion of the first electrode 120 connected thereto.

Therefore, as shown in FIG. 1, the connection electrode 300 may be arranged to connect multiple connection wires 220 arranged on the second substrate 200 to multiple first electrodes 120 provided on the first substrate 100, respectively. In addition, the wiring portion 303 constituting most of the connection electrode 300 may be disposed on the side surface of the second substrate 200. That is, the connection electrode 300 is locally disposed on the side surface of the second substrate 200.

With this configuration, the second substrate 200 made of a glass substrate and the connection electrode 300 may be protected from lateral impact. That is, when an impact is applied to the side of the display device 1000, the first substrate 100 made of a relatively flexible PCB may absorb the impact, and therefore the second substrate 200 and the connection electrode 300 may be protected from the lateral impact. Details will be described later.

Multiple light emitting elements 400 (410, 420, and 430) may be disposed on and electrically connected to the connection wire 220 to form individual pixels. The light emitting elements 400 may include a red light emitting element 410, a green light emitting element 420, and a blue light emitting element 430. The three light emitting elements 410, 420, and 430 may form individual pixels and be repeatedly disposed on the second substrate 200. The light emitting element may include at least one of an organic light emitting element and an inorganic light emitting element. Specifically, it may be an inorganic semiconductor Light Emitting Diode (LED).

The unit (individual) semiconductor LED 400 may have a dimension in units of micrometers (μm). The dimension in micrometers (μm) may mean that the width of at least one surface of the light emitting element 100 is several to hundreds of micrometers (μm).

Figure 3:
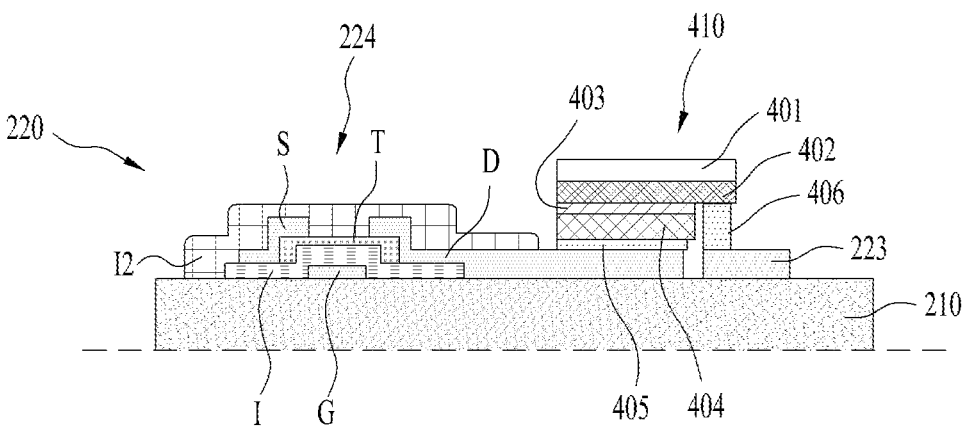
FIG. 3 is a partial cross-sectional view illustrating a connection wire of the display device according to the first embodiment of the present disclosure.

FIG. 3 is a partial cross-sectional view illustrating a connection wire of the display device according to the first embodiment of the present disclosure.

FIG. 3 illustrates an example case where the connection wire 220 includes a thin film transistor (TFT) 224. As mentioned above, the substrate base body 210 of the second substrate 200 may be a resin substrate, and the TFT 224 may be arranged in each individual sub-pixel region on the substrate base body 210.

As described above, the connection wire 220 may include the TFT 224. The TFT 224 may be configured by disposing a gate electrode G and an insulating layer I on the substrate base body 210, disposing a semiconductor layer T on the insulating layer, and disposing a source electrode S and a drain electrode D at both sides of the semiconductor layer T. The source electrode S and the drain electrode D may be coated with a second insulating layer 12.

In this case, the drain electrode D may be electrically connected to a first electrode 405 of the light emitting element 410. Also, a second electrode 406 of the light emitting element 410 may be connected to the third connection wire 223. In some cases, the third connection wire 223 may be identical to the second connection wire 222. In addition, the TFT 224 including the drain electrode D may be viewed as a component included in the first connection wire 221.

Here, the red light emitting element 410 is presented as an example of the light emitting element 410. However, it should be noted that the connection with the TFT and the structure of the light emitting element described herein may be equally applied to the other light emitting elements, for example, the green light emitting element 420 and the blue light emitting element 430.

FIG. 3 illustrates an example in which the light emitting element 410 is flip-chip bonded as a horizontal light emitting element. That is, the horizontal light emitting element may be configured by sequentially disposing a first conductive (e.g., n-type) semiconductor layer 402, an active layer 403, and a second conductive (e.g., p-type) semiconductor layer 404 on a substrate 401. The light emitting element 410 is connected to the drain electrode D and the third connection wire 223 in an inverted state.

The first electrode 405 is disposed on the second conductive semiconductor layer 404, and the second electrode 406 is disposed on a portion of the first conductive semiconductor layer 402 that is partially exposed.

As the light emitting element 410, a vertical light emitting element may be employed in addition to the horizontal light emitting element.

Figure 4:
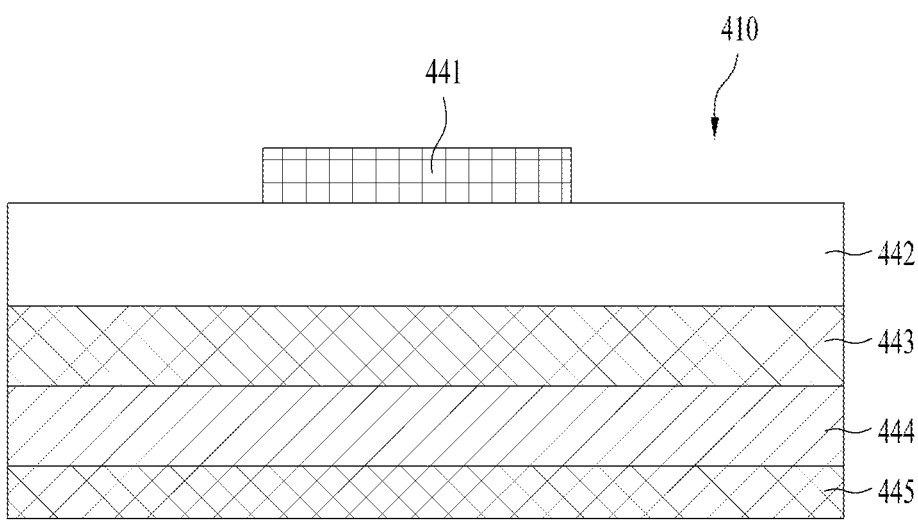
FIG. 4 is a cross-sectional view schematically showing an exemplary vertical light emitting element applicable to the display device according to the first embodiment of the present disclosure.

FIG. 4 is a cross-sectional view schematically showing an exemplary vertical light emitting element applicable to the display device according to the first embodiment of the present disclosure.

Referring to FIG. 4, the vertical light emitting element 410 may be configured by sequentially disposing a first conductive (e.g., p-type) semiconductor layer 444, an active layer 443, and a second conductive (e.g., n-type) semiconductor layer 442 on the first electrode 445. A second electrode 441 may be disposed on the second conductive semiconductor layer 442.

In the vertical light emitting element 410, electric current may flow from the first electrode 445 to the second electrode 441 in a vertical direction. Accordingly, when the vertical light emitting element 410 is employed, the first electrode 445 may be connected to the drain electrode D of the TFT 224, and the second electrode 441 may be connected to the third connection wire 223.

Figure 5:
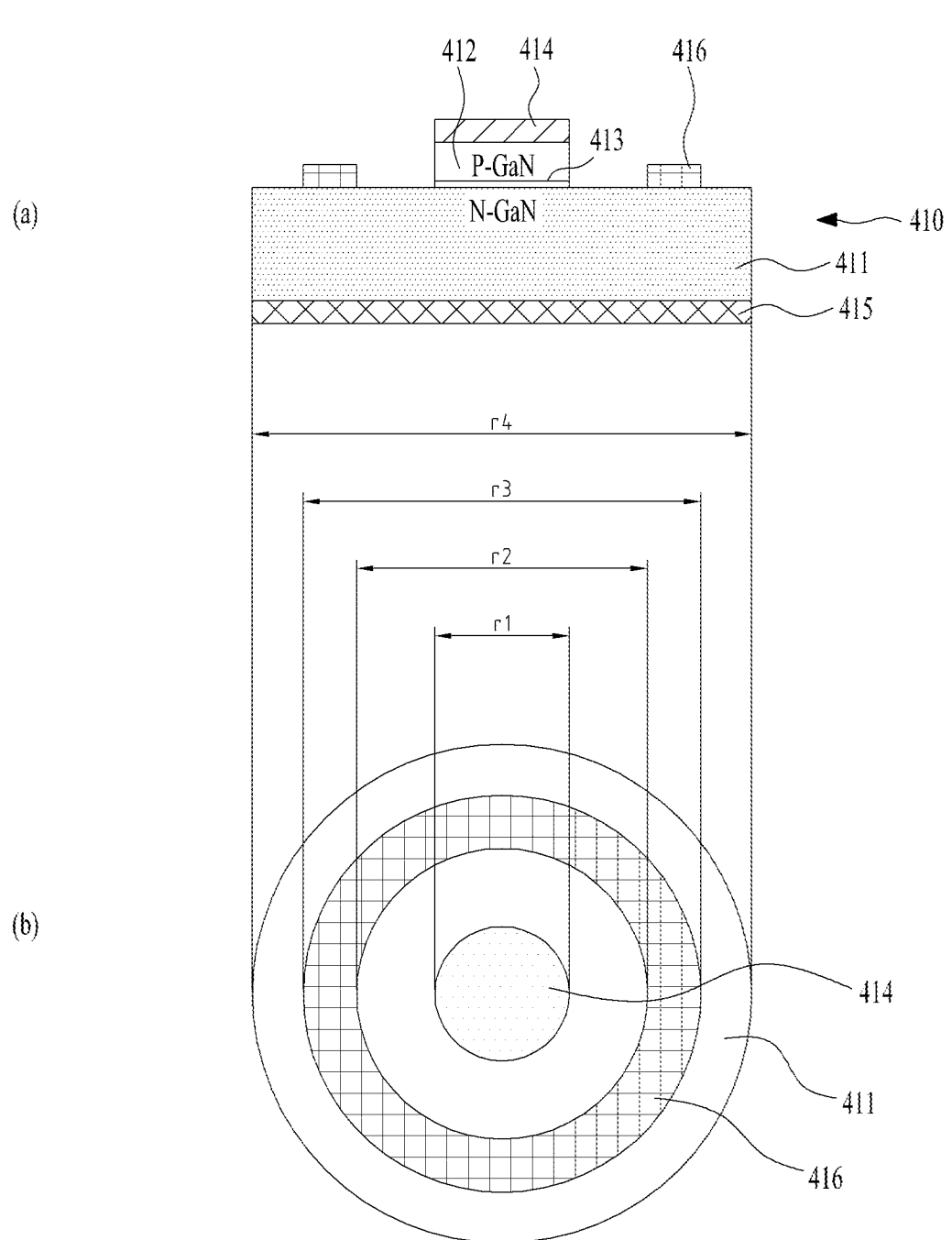
FIG. 5 is a cross-sectional view schematically showing another exemplary vertical light emitting element applicable to the display device according to the first embodiment of the present disclosure.

FIG. 5 is a cross-sectional view schematically showing another exemplary vertical light emitting element applicable to the display device according to the first embodiment of the present disclosure.

As mentioned above, the light emitting element (or LED) 410 may have a dimension in units of micrometers (μm). In the case of the micro LED 400 having a dimension in units of micrometers, the vertical light emitting element 410 may specifically have a structure as shown in FIG. 5. For example, the vertical light emitting element 410 may have a structure having a circular cross section.

In the light emitting element 410, an n-electrode 415 may be disposed at the bottom side, and a p-type gallium nitride (GaN)-based semiconductor layer (P-GaN) 412 may be disposed on an n-type gallium nitride (GaN)-based semiconductor layer (N-GaN) 411. In this case, an active layer 413 may be disposed between the n-type GaN-based semiconductor layer 411 and the p-type GaN-based semiconductor layer 412.

Also, a p-electrode 414 may be disposed on the p-type GaN-based semiconductor layer 412, and a magnetic member 416 may be disposed at the top of both sides of the n-type GaN-based semiconductor layer 411.

For example, in the case of a micro LED, in order to connect LEDs at individual sub-pixel positions, a magnetic method using a magnetic member may be used. That is, the individual light emitting elements 410 may be connected at pixel positions defining sub-pixels, using a magnetic force. To this end, the light emitting element 410 may include a magnetic member 416.

In the following description, the description of a method of installing a micro LED using a magnetic force or a detailed structure thereof will be skipped.

Referring back to FIGS. 1 and 2, the connection electrode 300 may connect an end portion of the first connection wire 221 to an end portion of the first electrode 120 of the first substrate 100 exposed by the first exposure portion 510.

Accordingly, the connection electrode 300 is locally disposed on the end portions of the multiple first connection wires 221.

In other words, the connection electrode 300 may not be exposed at the end side of the first substrate 100. In addition, the first electrode 120 and the second electrode 130 may be printed on a PCB, and the first electrode 120 and the second electrode 130 may be connected by the third electrode 140 arranged through the PCB.

Accordingly, according to the first embodiment of the present disclosure, there is no electrode exposed to the outside at the edge of the first substrate 100 and/or the display device is manufactured using the PCB. Accordingly, damage to the substrates 100 and 200 and the electrodes 120, 130, 140, 220, and 300 may be prevented in implementing the display device.

In addition, when a high-resolution display device having pixels with a narrow pitch is manufactured, the connection electrode 300 may be locally configured using the exposure portion 500. Accordingly, a display with a narrow bezel, a so-called zero bezel display may be effectively manufactured. In addition, a space-efficient and design-efficient high-resolution display may be implemented. Therefore, a large-area high-resolution zero bezel display may be manufactured.

As described above, efficient wire connection may be implemented and damage to the electrodes and the substrates may be prevented. Accordingly, the reliability and quality of the display device may be improved.

Figure 6:
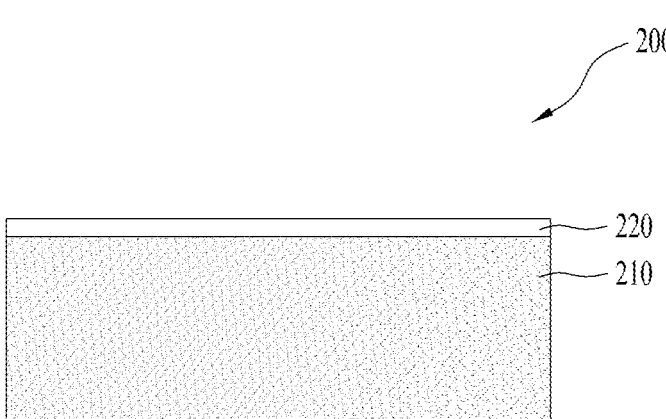
Figure 7:
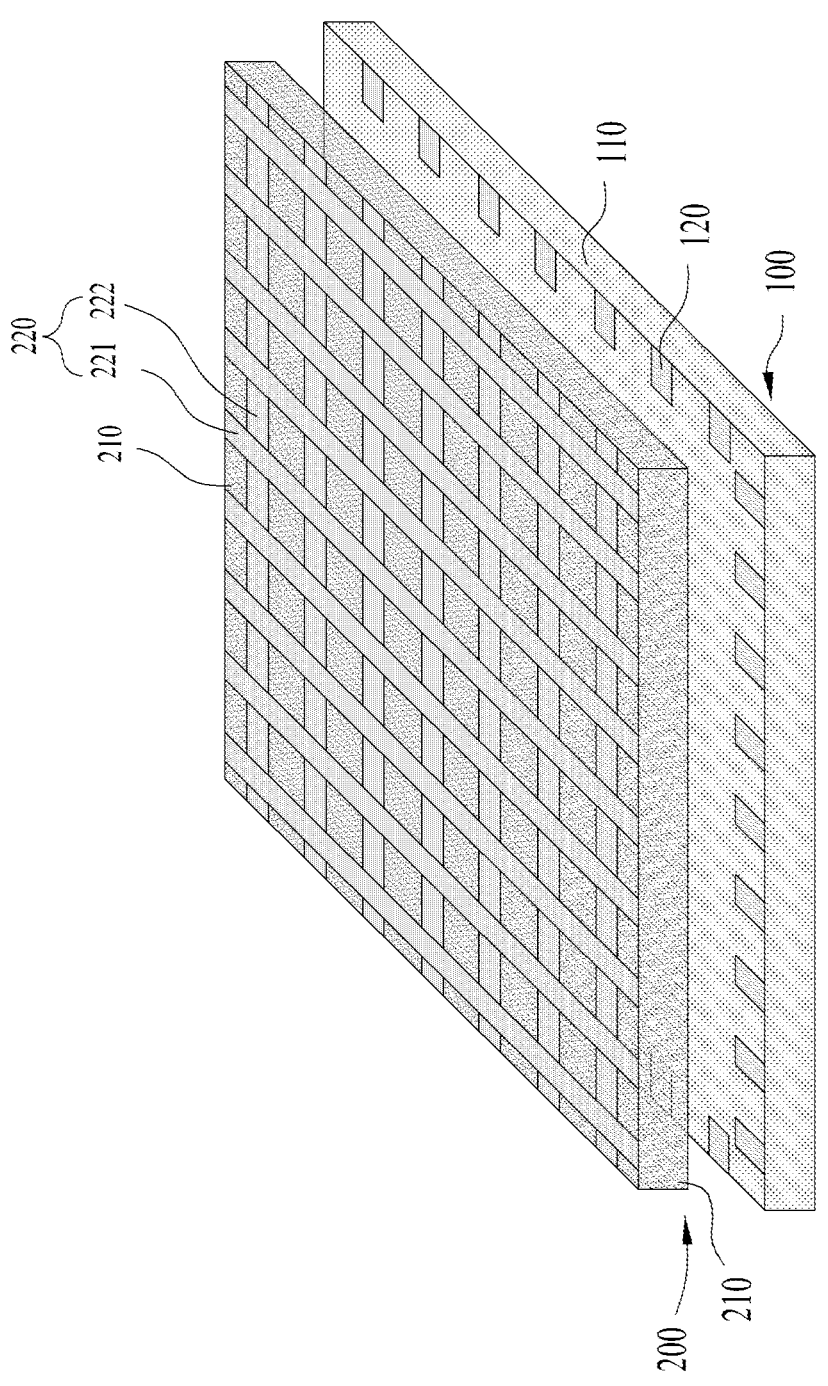
Figure 8:
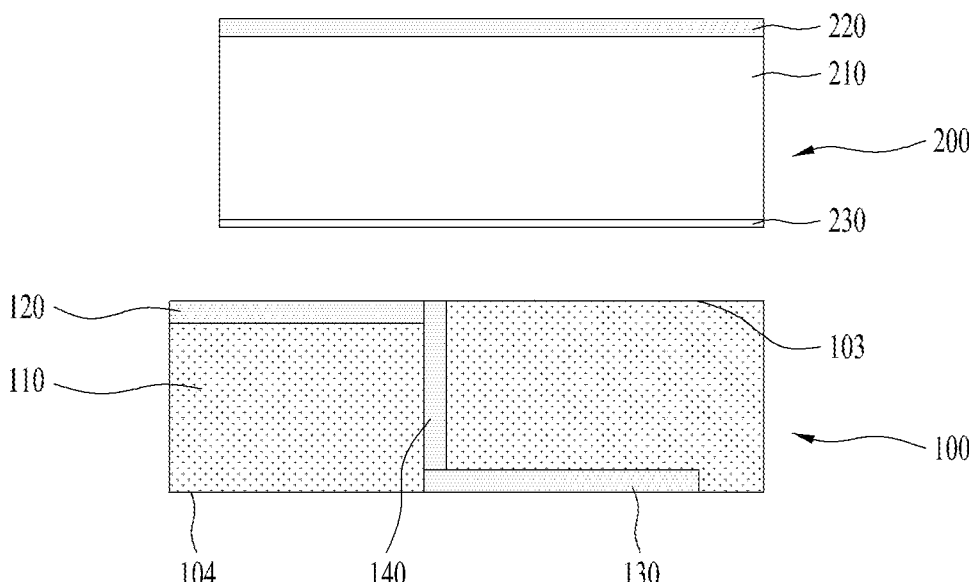
Figure 9:
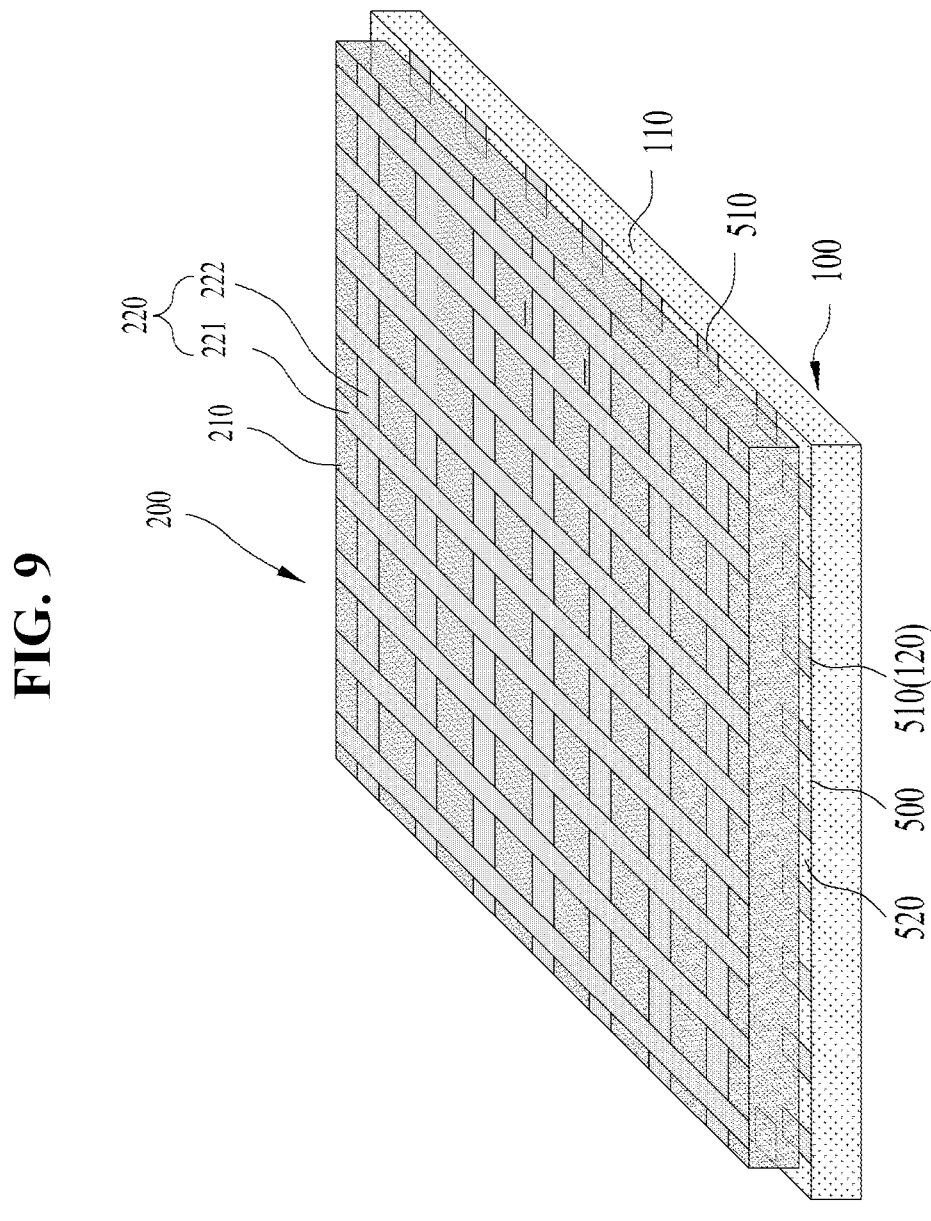
Figure 11:
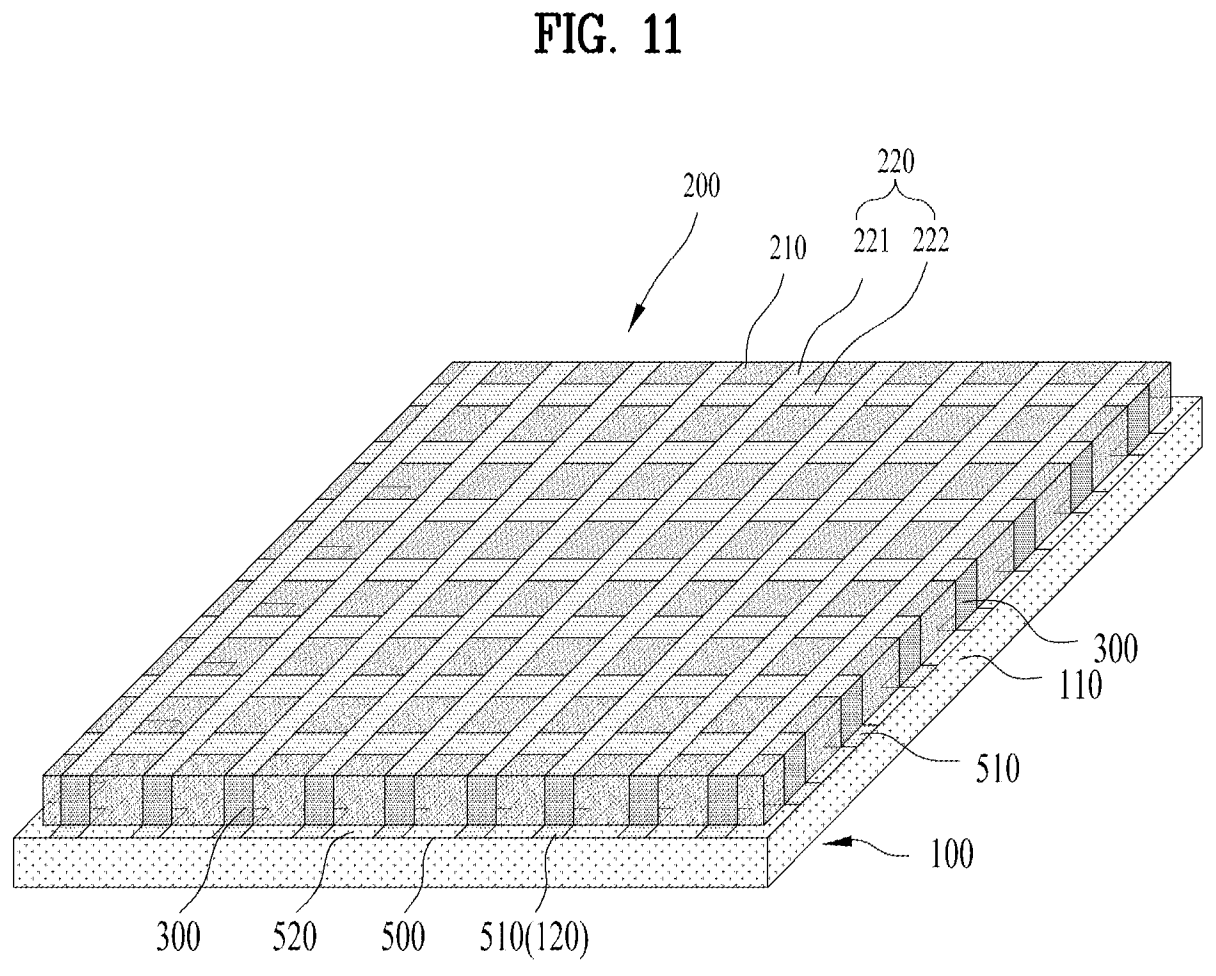

FIGS. 6 to 13 are views illustrating a process of manufacturing the display device according to the first embodiment of the present disclosure. In particular, FIGS. 7, 9, and 11 are perspective views illustrating a process of manufacturing the display device according to the first embodiment of the present disclosure, and FIGS. 6, 8, 10, and 12 are cross-sectional views showing related parts.

Hereinafter, a process of manufacturing the display device according to the first embodiment of the present disclosure will be described with reference to FIGS. 6 to 13. For the parts not described herein, description of the corresponding parts described above with reference to FIGS. 1 to 5 may be applied.

First, referring to FIG. 6, a connection wire 220 may be formed on the substrate base body 210 of the second substrate 200. For example, a glass substrate may be employed as the substrate base body 210, as mentioned above.

As described above, the connection wire 220 may define multiple individual pixel regions.

Referring to FIG. 7, the connection wire 221 (hereinafter, referred to as a first connection wire) arranged in one direction may be a pixel electrode (or a data electrode), and the connection line 222 (hereinafter, referred to as a second connection wire) arranged in another direction may be a common electrode.

As described above, sub-pixels may be defined at points where the first connection wires 221 and the second connection wires 222 cross each other.

When the first connection wire 221 is a pixel electrode (or a data electrode), the first connection wire 221 may include a thin film transistor (TFT). A detailed description thereof will be omitted.

Figure 10:
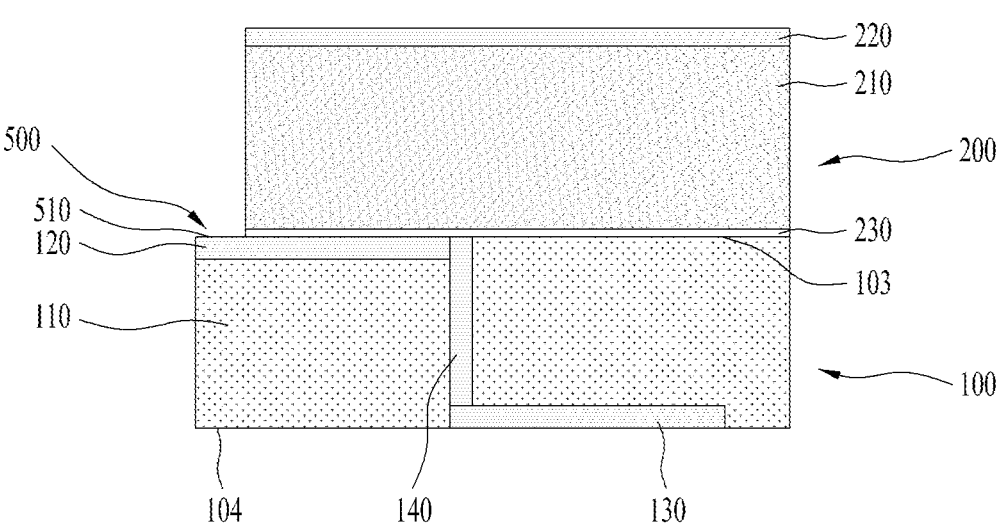

Referring to FIGS. 7 and 8, the second substrate 200 manufactured as described above may be placed on the first substrate 100. Then, as shown in FIGS. 9 and 10, the second substrate 200 may be attached to the first substrate 100.

Here, the first substrate 100 may include a first electrode 120, a second electrode 130, and a third electrode 140, as described above.

That is, the first electrode 120 may be disposed on a first surface 101 positioned on the substrate body 110. Also, the second electrode 130 may be disposed on a second surface 102 of the first substrate 100. The second electrode 130 may be electrically connected to the first electrode 120.

The second electrode 130 may be electrically connected to the first electrode 120 by the third electrode 140. The second electrode 130 may correspond to a pad electrode of the display device 1000. For example, the second electrode 130 may be an electrode connected to a driving power unit (not shown) of the display device 1000.

The third electrode 140 may be a through electrode arranged through the substrate body 110 to connect the first electrode 120 and the second electrode 130 to each other.

For example, the substrate body 110 may be a printed circuit board (PCB). That is, the first electrode 120 and the second electrode 130 may be electrodes printed on the PCB. The third electrode 140 may be arranged through the PCB.

The first substrate 100 may be the same as that described above with reference to FIGS. 1 and 2. Before the second substrate 200 is attached, the first substrate 100 having such a structure may be pre-manufactured. That is, the first substrate 100 may be pre-manufactured by forming the first electrode 120, the second electrode 130, and the third electrode 140 on the PCB.

As shown in FIG. 9 and FIG. 10, at least a portion of the first electrode 120 may be exposed at an end portion of the first substrate 100. That is, the first electrode 120 may be arranged on the substrate body 110 such that an end portion thereof reaches an edge of the substrate body 110.

The first substrate 100 and the second substrate 200 may be adhered by forming an adhesive layer on the opposite surface of at least one of the first substrate 100 and the second substrate 200.

In this case, the second substrate 200 may be attached to the first substrate 100 to have an exposure portion 500 exposing at least a portion of the first electrode 120 disposed at an edge of the first substrate 100.

As shown in the figure, the width of the second substrate 200 may be less than that of the first substrate 100. Accordingly, when the second substrate 200 is disposed on the first substrate 100, the first substrate 100 may not be fully covered by the second substrate 200, but may have an exposed portion. As described above, the exposure portion 500 may be formed on the portion of the first substrate 100 that is not covered by the second substrate 200.

The exposure portion 500 may include a first exposure portion 510 exposing an end portion of the first electrode 120 and a second exposure portion 520 exposing an end portion of the substrate body 110 of the first substrate 100. In FIG. 11, the exposed portion of the first electrode 120 may be identical to the first exposure portion 510.

Figure 12:
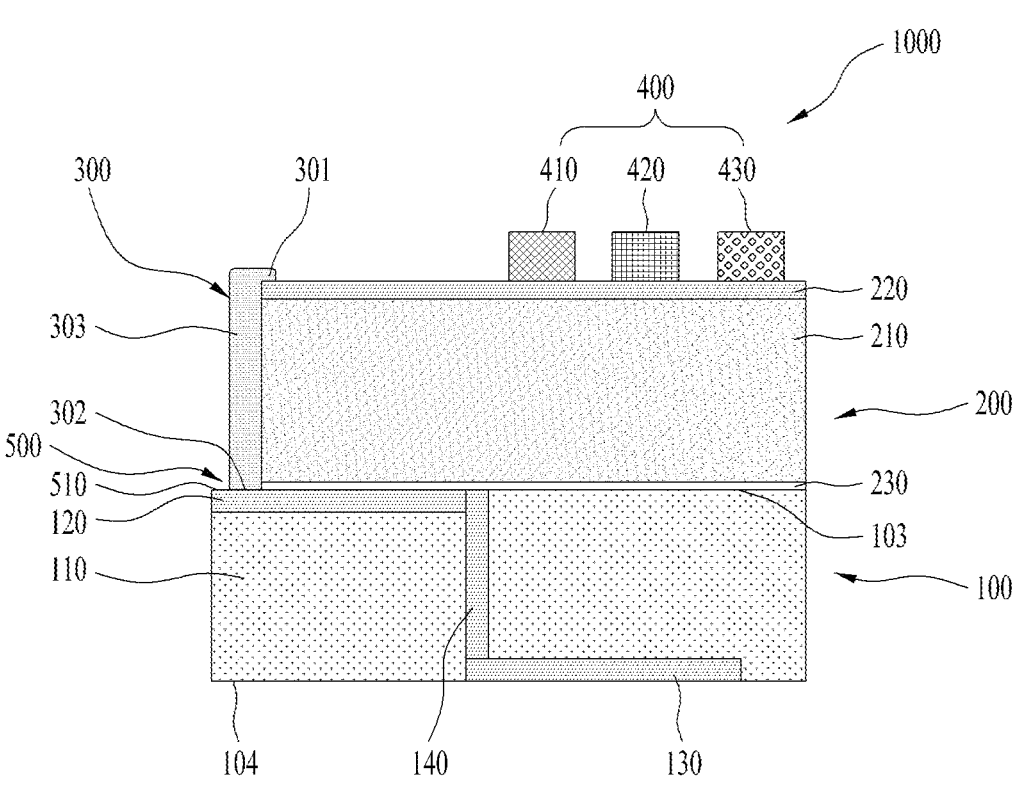

Next, referring to FIGS. 11 and 12, a connection electrode 300 connecting the first electrode 120 of the first substrate 100 to the connection wire 220 of the second substrate may be formed on a portion including the first exposure portion 510.

The connection electrode 300 may contact the exposure portion 500 to electrically connect the first electrode 120 of the first substrate 100 to the connection wire 220 of the second substrate 200.

Specifically, the connection electrode 300 may connect an end portion of the first connection wire 221 to an end portion of the first electrode 120 of the first substrate 100 exposed by the first exposure portion 510. The connection electrode 300 is locally disposed at the end portions of a plurality of first connection wires 221 and a side portion of the substrate base body 210 of the second substrate 200.

Multiple light emitting elements 400 (410, 420, and 430) may be disposed on and electrically connected to the connection wire 220 to form individual pixels. Then, the arrangements described above and shown in FIGS. 1 and 2 may be obtained.

The light emitting elements 400 may include a red light emitting element 410, a green light emitting element 420, and a blue light emitting element 430. The three light emitting elements 410, 420, and 430 may form individual pixels and be repeatedly disposed on the second substrate 200.

The light emitting element 400 may be arranged to be electrically connected to the connection wire 220 in various ways. As an example, multiple light emitting elements 400 may be connected simultaneously or step by step using a method based on a magnet, as mentioned above.

Accordingly, in some cases, multiple light emitting elements 400 may be attached to the first substrate 100 such that they are arranged on the connection wire 220 of the second substrate 200. That is, the connection electrode 300 may be formed after the light emitting elements 400 are attached to the first substrate 100 while being connected to the connection wire 220.

Figure 13:
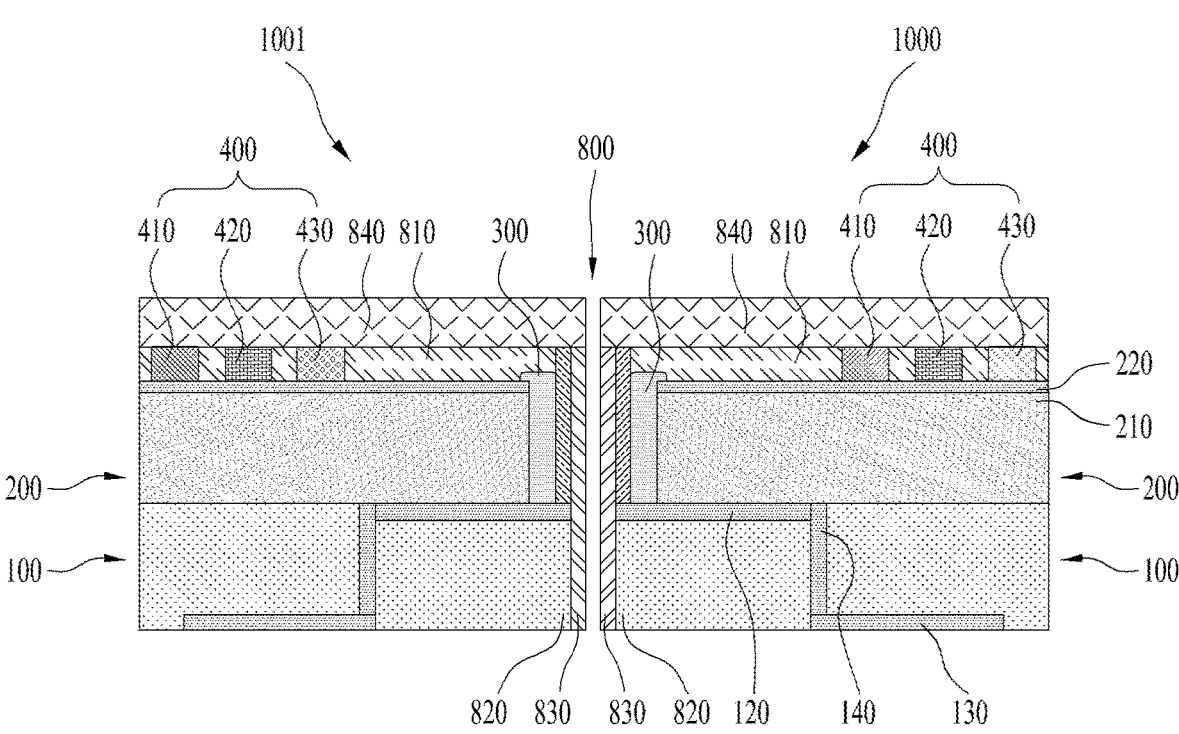

FIG. 13 is a cross-sectional view showing a modular display device according to the first embodiment of the present disclosure. The modular display device may be configured by bonding the display devices having the configurations of FIGS. 1 and 2 to each other.

FIG. 13 shows two display devices 1000 and 1001 attached to each other as modules. However, more than two display modules may be attached to each other to form a tile-type display device. Thereby, a large-area display device may be effectively manufactured.

Referring to FIG. 13, in addition to the configuration described with reference to FIG. 2, each of the display modules 1000 and 1001 may further include a flattened layer 810 disposed on the second substrate 200. That is, a flattened layer 810 to cover the connection wire, the light emitting element 400, the connection electrode 300, and the exposed portion of the first electrode 120 may be formed on the top surface of the second substrate 200 on which the light emitting element 400 is arranged.

An optical film 840 such as a color filter may be disposed on the flattened layer 810. The optical film 840 may adjust the color of the pixel when the light emitting element 400 is turned on.

A protective layer 830 disposed at an edge side of the first substrate 100 and an end portion of the flattened layer 810 may be further provided. The protective layer 830 may protect the display structure when the display modules are bonded to each other.

A black matrix 820 may be disposed between the protective layer 830 and the edge side of the first substrate 100 and the end portion of the flattened layer 810. The black matrix 820 may improve the contrast of pixels.

As described above, the two display modules 1000 and 1001 may be bonded to each other on a bonding interface 800 such that the protective layers 830 faces each other. Thereby, a modular display may be configured.

Referring to FIG. 13, it may be seen that the protective layers 830, the black matrices 820, and the substrate bodies 110 of the first substrates 100 are disposed at a portion where the two modules 1000 and 1001 contact each other. In this case, as described above, the substrate body 110 is a PCB. In addition, it may be seen that electrode elements such as the connection electrode 300 are not directly or indirectly exposed on the contact surface.

Accordingly, when the modular display device is implemented, damage to the substrates 100 and 200 and the electrodes 120, 130, 140, and 220 may be prevented.

In addition, when a high-resolution display device having pixels with a narrow pitch is manufactured, the connection electrode 300 may be locally configured using the exposure portion 500. Thereby, a narrow bezel display, a so-called zero bezel display may be effectively manufactured. In addition, a space-efficient and design-efficient high-resolution display may be implemented. Accordingly, a large-area high-resolution zero-bezel display may be manufactured.

As described above, efficient wire connection may be implemented and damage to the electrodes and the substrates may be prevented. Accordingly, the reliability and quality of the display device may be improved.

Figure 14:
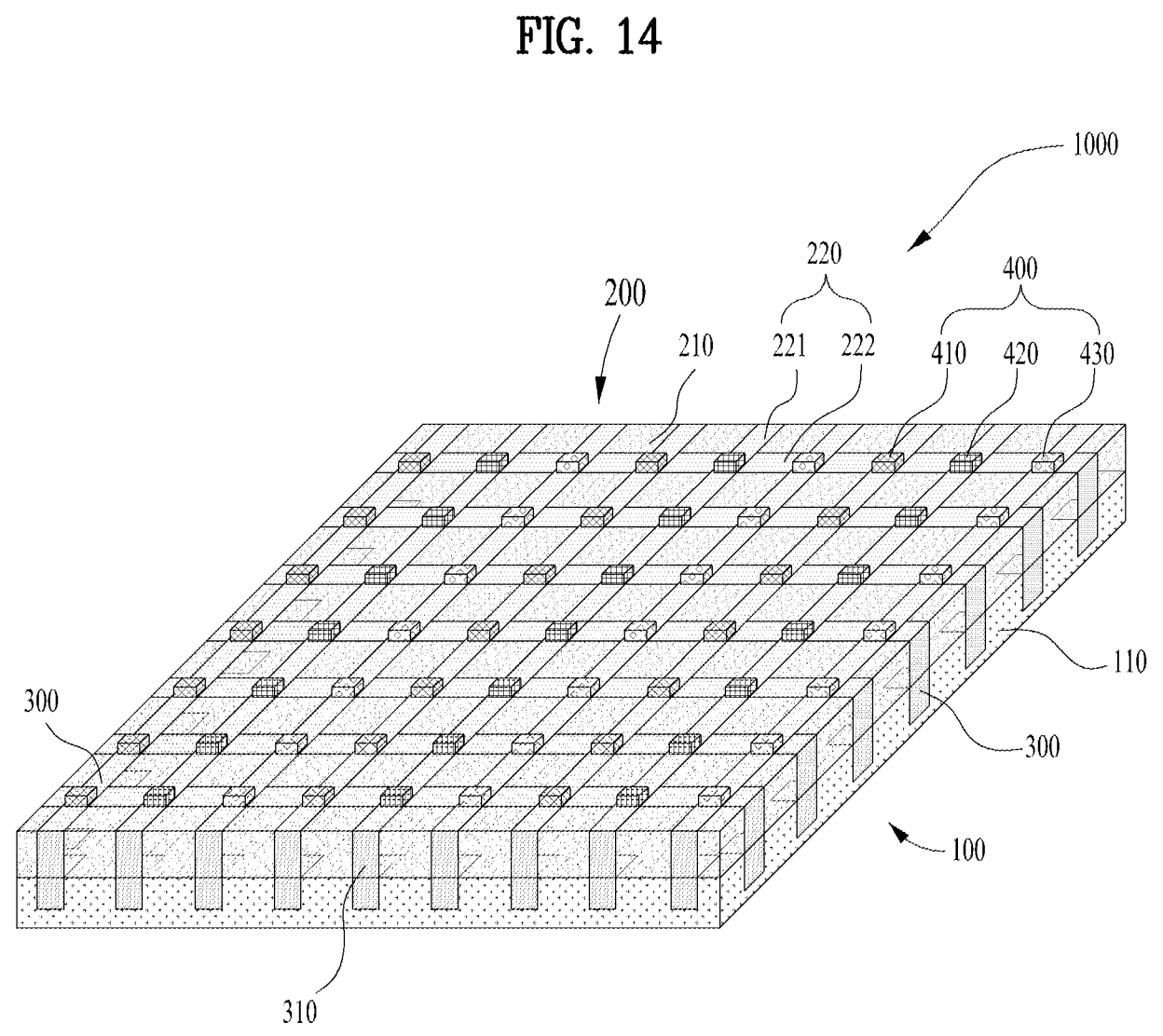
Figure 15:
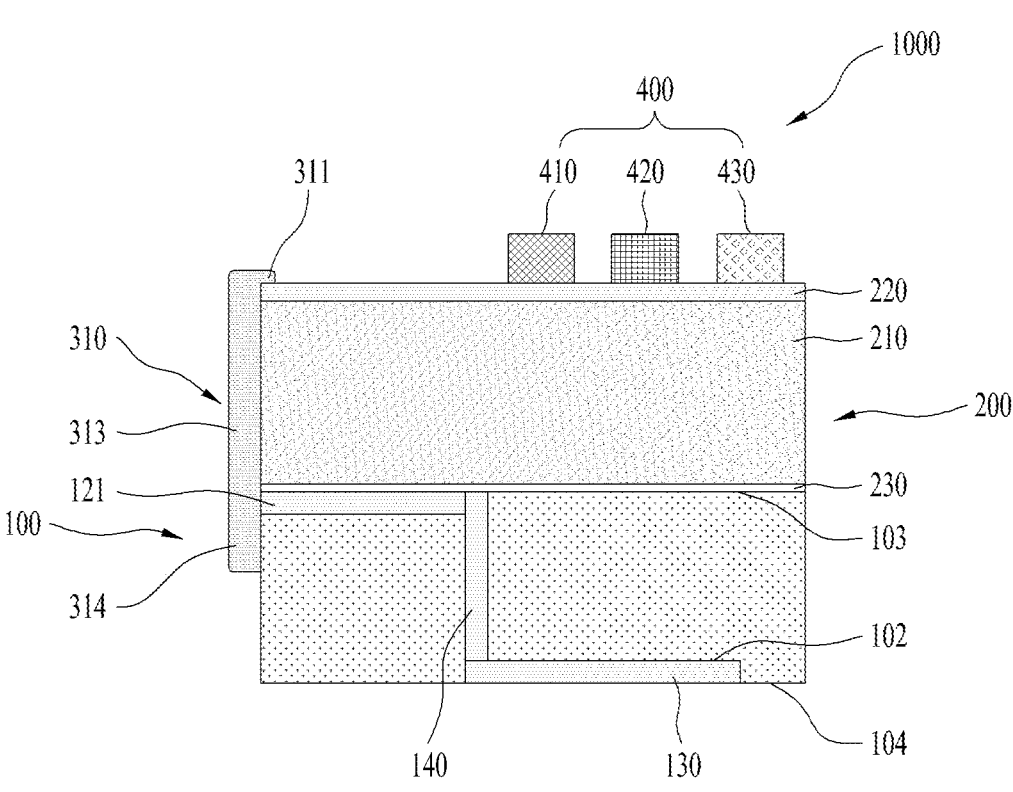
FIG. 15 is a partial cross-sectional view of FIG. 14.

FIG. 14 is a perspective view showing a display device according to a second embodiment of the present disclosure. FIG. 15 is a partial cross-sectional view of FIG. 14.

FIG. 14 is an enlarged view showing the configuration of the display device. In FIG. 15, some parts may be omitted or briefly illustrated. The pixel spacing in FIG. 15, may not exactly match that in FIG. 14. For example, in FIG. 15, the pixel spacing may be shown to be narrower than the pixel spacing in FIG. 14. This is intended for efficiency of illustration of the drawings.

Hereinafter, the display device according to the second embodiment of the present disclosure will be described in detail with reference to FIGS. 14 and 15. In this case, description of parts that are the same as those in the first embodiment of the present disclosure may be simplified or omitted. Therefore, in interpreting the present disclosure, it is apparent that the description of the first embodiment given above may be equally applied to the second embodiment described herein unless otherwise stated.

Referring to FIGS. 14 and 15, the display device 1000 according to the second embodiment of the present disclosure may include a first substrate 100 including a first electrode 120, a second substrate 200 disposed on the first substrate 100 and including a connection wire 220 defining a plurality of individual pixel regions, a connection electrode 310 connecting the first electrode 120 to the connection wire 220, and a light emitting element 400 connected to the connection wire 200.

The first electrode 120 may be disposed on a first surface 101 positioned on the substrate body 110. A second electrode 130 may be disposed on a second surface 102 of the first substrate 100. The second electrode 130 may be electrically connected to the first electrode 120.

The second electrode 130 may be electrically connected to the first electrode 120 by a third electrode 140. The second electrode 130 may correspond to a pad electrode of the display device 1000. For example, the second electrode 130 may be an electrode connected to a driving power unit (not shown) of the display device 1000.

The third electrode 140 may be a through electrode arranged through the substrate body 110 to connect the first electrode 120 and the second electrode 130 to each other.

For example, the substrate body 110 may be a printed circuit board (PCB). That is, the first electrode 120 and the second electrode 130 may be electrodes printed on the PCB. The third electrode 140 may be arranged through the PCB.

Referring to FIG. 15, at least a portion of the first electrode 120 may be exposed at an end portion of the first substrate 100. That is, the first electrode 120 may be arranged on the first surface 101 of the substrate body 110 such that an end portion 121 thereof reaches an edge of the substrate body 110. In addition, an opposite end portion of the first electrode 120 may be connected to the third electrode 140.

The third electrode 140 may be arranged to substantially extend through the substrate body 110 in a vertical direction. In addition, one end portion of the second electrode 130 may be connected to the third electrode 140 on the side of the bottom surface 104 of the first substrate 100. In this case, the opposite end portion of the second electrode 130 may face away from the first electrode 120. That is, the second electrode 130 may be arranged to extend by a predetermined length from a point where it is connected to the third electrode 140 toward an opposite side of the edge of the substrate body 110.

The second substrate 200 may be disposed on the top surface 103 of the first substrate 100. The second substrate 200 may be disposed on the first substrate 100 to have an exposure portion 121 that exposes at least a portion 121 of the first electrode 120 of the first substrate 100.

The exposure portion 121 may be a portion 121 of the first electrode 120 exposed between the first substrate 100 and the second substrate 200.

For example, referring to FIG. 15, the first electrode 120 may be disposed between the first substrate 100 and the second substrate 200. In this case, the entire width of the first substrate 100 may be substantially equal to that of the second substrate 200, and an end portion (exposure portion 121) of the first electrode 120 arranged between the first substrate 100 and the second substrate 200 may be exposed.

The second substrate 200 may be a substrate for forming a connection wire 220 including a TFT. As an example, the second substrate 200 may have a glass substrate as a base body. That is, connection wires 220 defining multiple individual pixel areas may be provided on the substrate base body 210, which is a glass substrate. Hereinafter, an embodiment of the present disclosure will be described mainly focusing on an example in which a glass substrate is used as the second substrate 200.

In this case, the thickness of the glass substrate may be similar to or the same as that of the first substrate 100. The glass substrate may be suitable to form a connection wire 220 including a TFT.

The second substrate 200 may be attached to the first substrate 100 by an adhesive layer 230. However, in some cases, the second substrate 200 may be directly formed on the first substrate 100.

As shown in FIG. 14, the connection wire 220 defining individual pixel regions may be formed in a grid shape on the substrate base body 210. Here, the individual pixels may substantially mean sub-pixels. For example, three sub-pixels may be grouped to form one pixel. For example, in FIG. 14 and FIG. 15, three light emitting elements 410, 420, and 430 may be red, green, and blue light emitting elements, respectively. Each of the light emitting elements may constitute a sub-pixel, and the three light emitting elements 410, 420, and 430 may constitute one pixel.

In this case, in FIG. 14, a connection wire 221 (hereinafter, referred to as a first connection wire) arranged in one direction may be a pixel electrode (or a data electrode), and a connection line 222 (hereinafter, referred to as a second connection wire) arranged in another direction may be a common electrode, or vice versa.

As described above, sub-pixels may be defined at points where the first connection wires 221 and the second connection wires 222 cross each other.

When the first connection wire 221 is a pixel electrode (or a data electrode), the first connection wire 221 may include a thin film transistor (TFT). Accordingly, the light emitting elements 410, 420, and 430 may be driven by the switching operation by the TFT. The details of the TFT and the light emitting element 400 may be the same as those described with reference to FIGS. 3 to 5.

As mentioned above, the second substrate 200 may be disposed on the first substrate 100 to provide an exposure portion 121 exposing at least a portion of the first electrode 120 of the first substrate 100.

The exposure portion 121 may correspond to a portion by which the first electrode 120 is exposed between the first substrate 100 and the second substrate 200.

For example, referring to FIG. 15, the first electrode 120 may be disposed between the first substrate 100 and the second substrate 200. In this case, the entire width of the first substrate 100 may be substantially equal to that of the second substrate 200, and the end portion of the first electrode 120 between the first substrate 100 and the second substrate 200 may be exposed. When the second substrate 200 is disposed on the first substrate 100, the first substrate 100 and the second substrate 200 may be substantially matched.

A connection electrode 310 to connect the first electrode 120 of the first substrate 100 and the connection wire 220 of the second substrate to each other may be provided to a portion including the exposure portion.

That is, the connection electrode 310 may contact the first electrode 120 of the first substrate 100 through the exposure portion 500 and electrically connect the first electrode 120 of the first substrate 100 with the connection wire 220 of the second substrate 200.

The connection electrode 310 may electrically connect the connection wire 220 of the first electrode 120 to the second substrate 200 using a conductive material such as Ag, Cu, or Al.

In this case, the connection electrode 310 may contact the exposure portion 121 by the side surface of the second substrate 200 to electrically connect the first electrode 120 of the first substrate 100 and the connection wire 220 of the substrate 200 to each other.

The connection electrode 310 may be connected to the connection wire 220 by the side surface of the connection electrode 310. Alternatively, as shown in FIG. 15, the connection electrode 310 may include a protrusion 311 protruding toward the connection wire 220 to contact the top surface of the connection wire 220.

The connection electrode 310 may also include a lower contact portion 314 contacting an upper portion of the first electrode 120 by the exposure portion 121.

That is, the connection electrode 310 may include the protrusion 311 arranged to contact the top surface of the connection wire 220, the lower contact portion 314 arranged to contact the upper portion of the first electrode 120, and a wiring portion 313 arranged to contact a side surface of the second substrate 200.

In this case, the lower contact portion 314 may be formed to extend further downward below the exposure portion 121 of the first electrode 120. That is, the lower contact portion 314 may sufficiently cover the exposure portion 121 while contacting the exposure portion 121.

In the connection electrode 310, the width of the wiring portion 313 may be substantially equal to the width of the connection wire 220 connected thereto. In addition, the width of the wiring portion 313 may be substantially equal to the width of the upper portion of the first electrode 120 connected thereto.

Therefore, as shown in FIG. 15, the connection electrode 310 may be arranged to connect multiple connection wires 220 arranged on the second substrate 200 to multiple first electrodes 120 provided on the first substrate 100, respectively. In addition, the wiring portion 313 constituting most of the connection electrode 310 may be disposed on the side surface of the second substrate 200. That is, the connection electrode 310 is locally disposed on the side surface of the second substrate 200 and a portion of the side surface of the first substrate 100.

With this configuration, the second substrate 200 made of a glass substrate and the connection electrode 310 may be protected from lateral impact. That is, when an impact is applied to the side of the display device 1000, the first substrate 100 made of a relatively flexible PCB may absorb the impact, and therefore the second substrate 200 and the connection electrode 310 may be protected from the lateral impact. Details will be described later.

That is, the connection electrode 310 may be disposed in the through portion 530 to contact the first electrode 120, and extend to the top of the connection wire 220 to electrically connect the first electrode 120 of the first substrate 100 to the connection wire 220 of the second substrate 200.

The connection electrode 310 may electrically connect the connection wire 220 of the first electrode 120 to the second substrate 200 using a conductive material such as Ag, Cu, or Al.

Specifically, referring to FIG. 14, the connection electrode 310 is locally disposed at the end portions of a plurality of first connection wires 221 and a side surface of the second substrate 200.

Multiple light emitting elements 400 (410, 420, and 430) may be disposed on and electrically connected to the connection wire 220 to form individual pixels. The light emitting elements 400 may include a red light emitting element 410, a green light emitting element 420, and a blue light emitting element 430. The three light emitting elements 410, 420, and 430 may form individual pixels and be repeatedly disposed on the second substrate 200. The light emitting element may include at least one of an organic light emitting element and an inorganic light emitting element. Specifically, it may be an inorganic semiconductor Light Emitting Diode (LED).

The unit (individual) semiconductor LED 400 may have a dimension in units of micrometers (μm). The dimension in micrometers (μm) may mean that the width of at least one surface of the light emitting element 100 is several to hundreds of micrometers (μm).

As described above, the connection electrode 310 may connect the end portion of the first connection wire 221 and the end portion (exposure portion) 121 of the first electrode 120 to each other.

Accordingly, according to the second embodiment of the present disclosure, the display device is manufactured using the PCB, and therefore damage to the substrates 100 and 200 and the electrodes 120, 130, 140, and 220 may be prevented in implementing the display device.

In addition, when a high-resolution display device having pixels with a narrow pitch is manufactured, the connection electrode 310 may be locally configured. Accordingly, a display with a narrow bezel, a so-called zero bezel display may be effectively manufactured. In addition, a space-efficient and design-efficient high-resolution display may be implemented. Therefore, a large-area high-resolution zero bezel display may be manufactured.

As described above, efficient wire connection may be implemented and damage to the electrodes and the substrates may be prevented. Accordingly, the reliability and quality of the display device may be improved.

Figure 16:
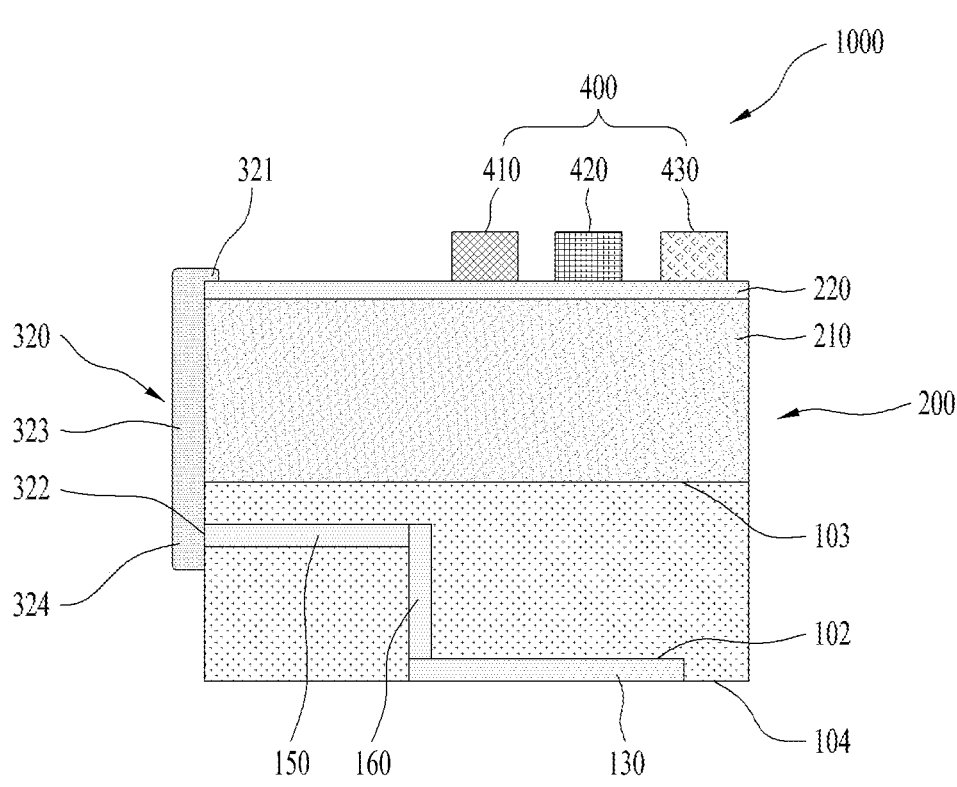
FIG. 16 is a partial cross-sectional view showing a display device according to a third embodiment of the present disclosure.

FIG. 16 is a partial cross-sectional view showing a display device according to a third embodiment of the present disclosure.

Referring to FIG. 16, the display device 1000 according to the third embodiment of the present disclosure may include a first substrate 100 including a first electrode 120, a second substrate 200 disposed on the first substrate 100 and including a connection wire 220 defining a plurality of individual pixel regions, a connection electrode 320 connecting the first electrode 120 to the connection wire 220, and a light emitting element 400 connected to the connection wire 200.

Hereinafter, differences of the third embodiment from the second embodiment will be mainly described.

The first electrode 150 of the first substrate 100 may be disposed inside the substrate body 110 of the first substrate 100 rather than on the upper surface of the first substrate 100. Accordingly, the length of a third electrode 160 connected to the second electrode 130 may be less than in the second embodiment.

The connection electrode 320 may be connected to the connection wire 220 by the side surface of the connection electrode 320. Alternatively, as shown in FIG. 16, the connection electrode 320 may include a protrusion 321 protruding toward the connection wire 220 to contact the top surface of the connection wire 220.

The connection electrode 320 may also include a lower contact portion 324 contacting an upper portion of the first electrode 120 by the exposure portion 322.

That is, the connection electrode 320 may include the protrusion 321 arranged to contact the top surface of the connection wire 220, the lower contact portion 324 arranged to contact the upper portion of the first electrode 120, and a wiring portion 323 arranged to contact a side surface of the second substrate 200.

In this case, the lower contact portion 324 may be formed to extend further downward below the exposure portion 322 of the first electrode 120. That is, the lower contact portion 324 may sufficiently cover the exposure portion 322 while contacting the exposure portion 322.

In the connection electrode 320, the width of the wiring portion 323 may be substantially equal to the width of the connection wire 220 connected thereto. In addition, the width of the wiring portion 323 may be substantially equal to the width of the upper portion of the first electrode 120 connected thereto.

Figure 17:
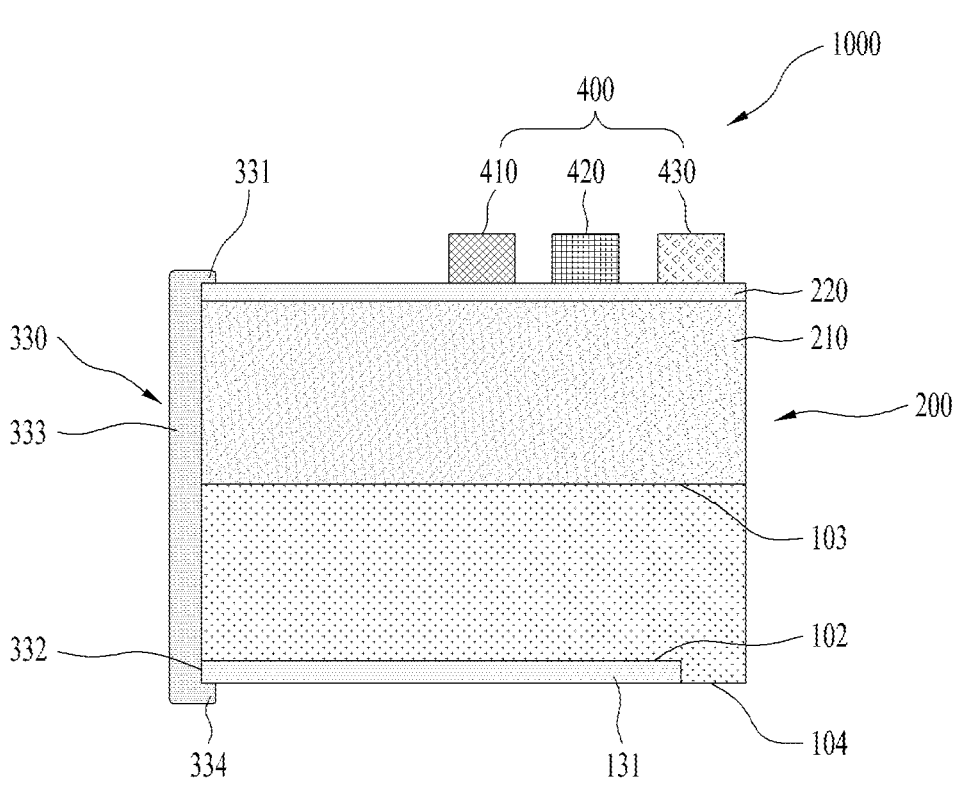
FIG. 17 is a partial cross-sectional view showing a display device according to a fourth embodiment of the present disclosure.

FIG. 17 is a partial cross-sectional view showing a display device according to a fourth embodiment of the present disclosure.

Referring to FIG. 17, the display device 1000 according to the fourth embodiment of the present disclosure may include a first substrate 100 including a lower electrode 131, a second substrate 200 disposed on the first substrate 100 and including a connection wire 220 defining a plurality of individual pixel regions, a connection electrode 330 connecting the lower electrode 131 to the connection wire 220, and a light emitting element 400 connected to the connection wire 200.

Hereinafter, differences of the fourth embodiment from the first embodiment will be mainly described.

The lower electrode 131 may be disposed on the bottom surface (second surface) 102 of the first substrate 100. The second surface 102 on which the lower electrode 131 is disposed may be a surface facing away from the first surface 101.

The lower electrode 131 may correspond to the pad electrode of the display device 1000. For example, the lower electrode 131 may be an electrode connected to a driving power unit (not shown) of the display device 1000.

The connection electrode 330 may be connected to the connection wire 220 by the side surface of the connection electrode 330. Alternatively, as shown in FIG. 17, the connection electrode 330 may include a first protrusion 331 protruding toward the connection wire 220 to contact the top surface of the connection wire 220.

The connection electrode 330 may also include a second protrusion 334 protruding toward the lower electrode 131 to contact the bottom surface of the lower electrode 131.

That is, the connection electrode 330 may include the first protrusion 331 arranged to contact the top surface of the connection wire 220, the second protrusion 334 arranged to contact the bottom surface of the lower electrode 131, and a wiring portion 333 arranged to contact a side surface of the second substrate 200.

In the connection electrode 330, the width of the wiring portion 333 may be substantially equal to the width of the connection wire 220 connected thereto. In addition, the width of the wiring portion 333 may be substantially equal to the width of the upper portion of the first electrode 120 connected thereto.

The connection electrode 330 having such a configuration may electrically connect the connection wire 220 and the lower electrode 131. In this case, the connection electrode 330 may protect the side surfaces of the first substrate 100 and the second substrate 200. To this end, as an example, the connection electrode 330 may be formed of a highly ductile metal.

Figure 18:
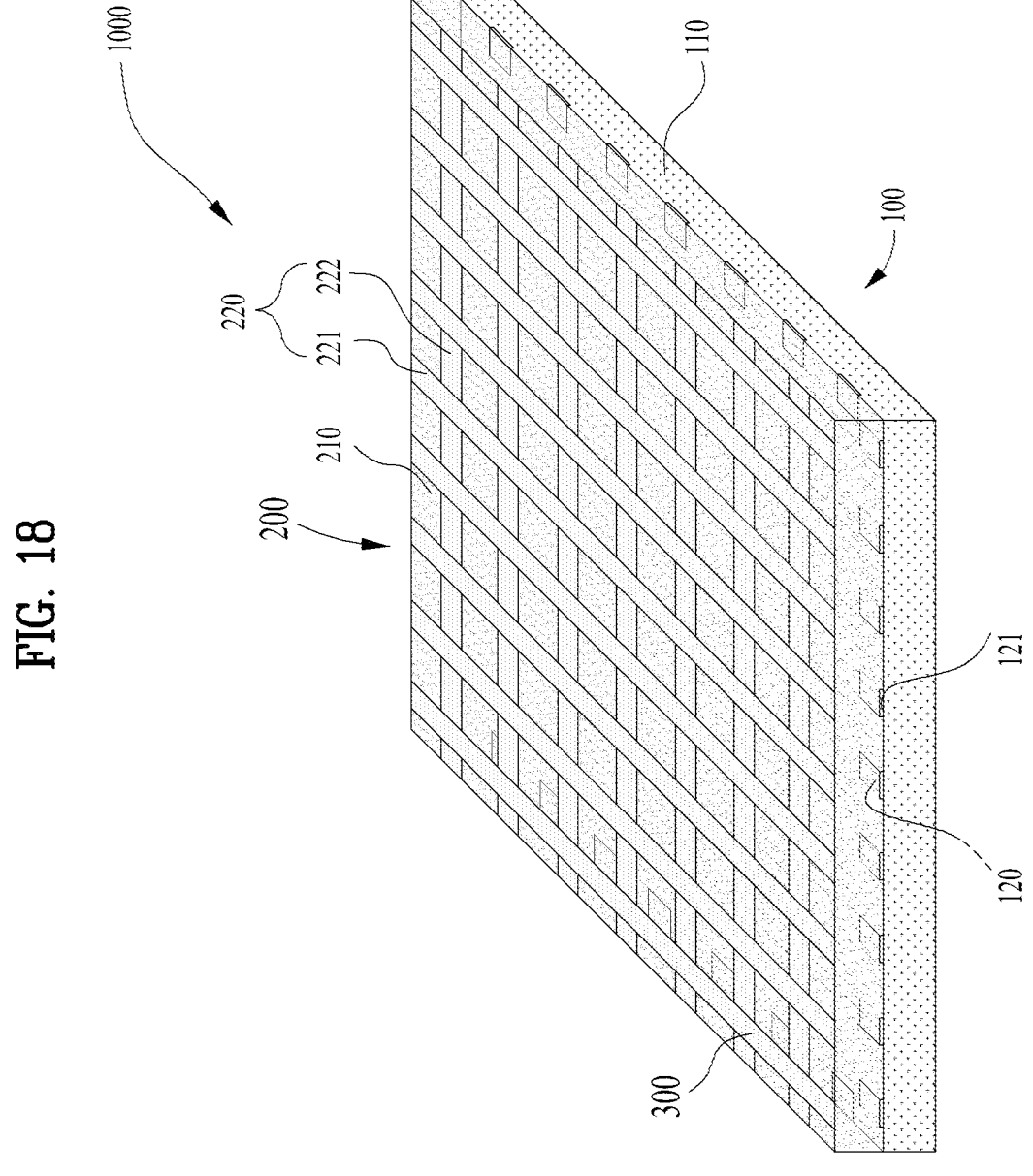
FIGS. 18 and 19 are perspective views illustrating a process of manufacturing the display device according to the second embodiment of the present disclosure.
Figure 19:
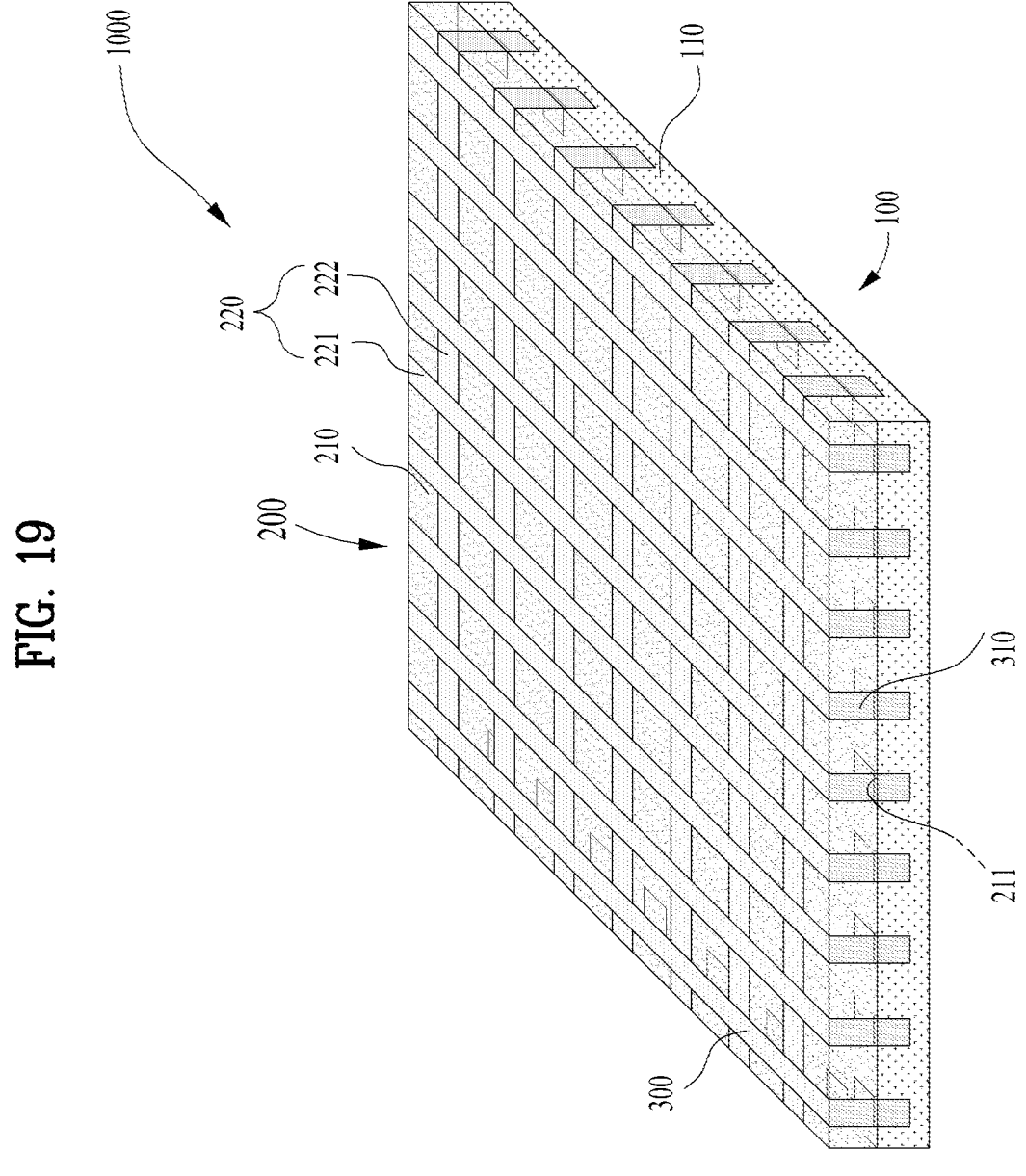

FIGS. 18 and 19 are perspective views illustrating a process of manufacturing the display device according to the second embodiment of the present disclosure.

Hereinafter, a process of manufacturing the display device according to the second embodiment of the present disclosure will be described with reference to FIGS. 18 and 19. The manufacturing processes of the third and fourth embodiments are omitted. However, at least a part of the manufacturing process of the display device according to the second embodiment may be commonly applied.

For content not described herein, the details described with reference to FIGS. 6 to 12 may be equally applied to the present embodiment.

However, in the description referring to FIGS. 6 to 12, descriptions related to the sizes of the first substrate 100 and the second substrate 200 may be different from those of the present embodiment. Accordingly, the configuration of the exposure portion 500 that may result from the difference in size between the first substrate 100 and the second substrate 200 may be different from that of the second embodiment.

Specifically, in the present embodiment, the sizes of the first substrate 100 and the second substrate 200 may be substantially the same. Accordingly, when the second substrate 200 is disposed on the first substrate 100, the second substrate 200 may be substantially matched with the first substrate 100.

Hereinafter, a description of components described with reference to FIGS. 6 to 12 will be omitted, and a manufacturing process following the state shown in FIG. 11 will be described.

First, referring to FIG. 18, the size of the first substrate 100 is substantially equal to that of the second substrate 200, and accordingly there may not be an exposed portion at the edge side of the first substrate 100 or the second substrate 200.

Referring to FIG. 18, as mentioned above, the second substrate 200 may be disposed on the first substrate 100 to provide an exposure portion 121 exposing at least a portion 121 of the first electrode 120 of the first substrate 100.

The exposure portion 121 may correspond to a portion 121 by which the first electrode 120 is exposed between the first substrate 100 and the second substrate 200.

For example, the first electrode 120 may be disposed between the first substrate 100 and the second substrate 200. In this case, the entire width of the first substrate 100 may be substantially equal to that of the second substrate 200, and the end portion (the exposure portion) 121 of the first electrode 120 between the first substrate 100 and the second substrate 200 may be exposed.

Next, referring to FIG. 19, a connection electrode 310 connecting the first electrode 120 of the first substrate 100 to the connection wire 220 of the second substrate may be provided to a portion provided with the through portion 530.

The connection electrode 310 may electrically connect the end portion (exposure portion) 121 of the first electrode 120 to the connection wire 220 of the second substrate 200.

The connection electrode 310 may electrically connect the connection wire 220 of the first electrode 120 to the second substrate 200 using a conductive material such as Ag, Cu, or Al.

Specifically, the connection electrode 310 may extend to connect the end portion 121 of the first electrode 120 to a portion where the connection wire 220 is disposed.

Multiple light emitting elements 400 (410, 420, and 430) may be disposed on and electrically connected to the connection wire 220 to form individual pixels. Then, the arrangements shown in FIGS. 14 and 15 described above may be obtained.

The light emitting elements 400 may include a red light emitting element 410, a green light emitting element 420, and a blue light emitting element 430. The three light emitting elements 410, 420, and 430 may form individual pixels and be repeatedly disposed on the second substrate 200.

The light emitting element 400 may be arranged to be electrically connected to the connection wire 220 in various ways. As an example, multiple light emitting elements 400 may be connected simultaneously or step by step using a method based on a magnet, as mentioned above.

Accordingly, in some cases, multiple light emitting elements 400 may be attached to the first substrate 100 such that they are arranged on the connection wire 220 of the second substrate 200. That is, the connection electrode 310 may be formed after the light emitting elements 400 are attached to the first substrate 100 while being connected to the connection wire 220.

Figure 20:
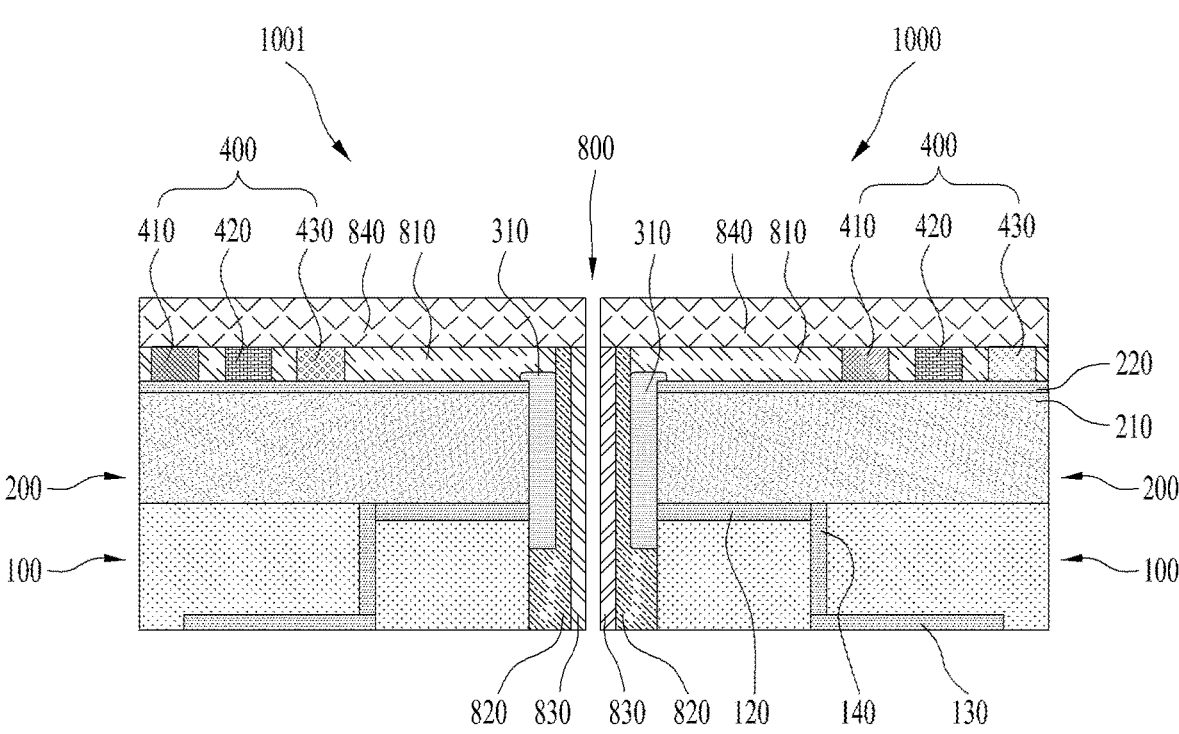
FIG. 20 is a cross-sectional view showing a modular display device according to the second embodiment of the present disclosure.
Figure 21:
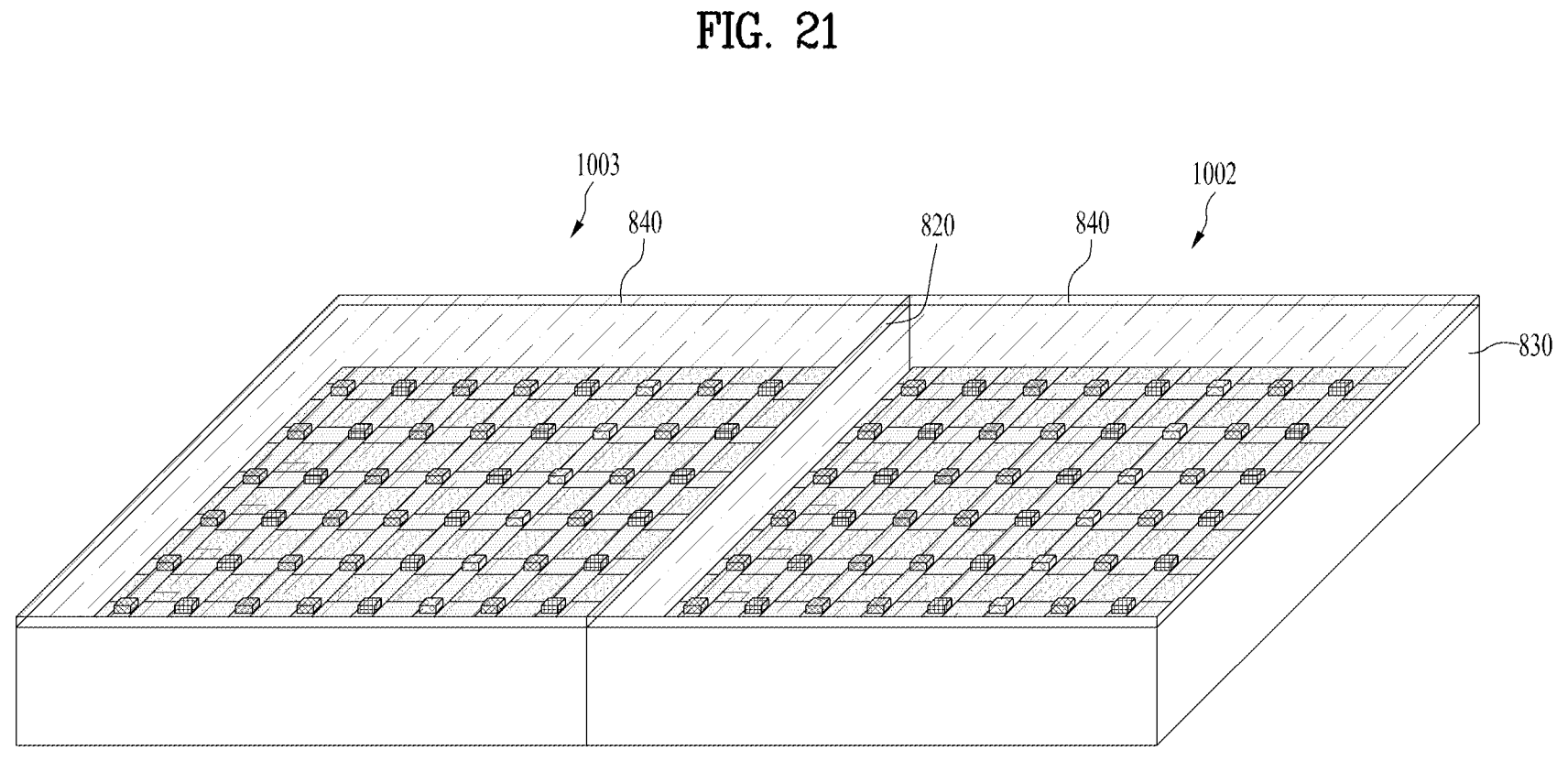

FIG. 20 is a cross-sectional view showing a modular display device according to the second embodiment of the present disclosure. FIG. 21 is a perspective view showing the modular display device according to the second embodiment of the present disclosure.

The modular display device may be configured by bonding the display devices having the configurations of FIGS. 14 and 15 to each other.

FIGS. 20 and 21 illustrate two display devices 1002 and 1003 attached to each other as modules. However, more than two display modules may be attached to each other to form a tile-type display device. Thereby, a large-area display device may be effectively manufactured.

Referring to FIG. 20, in addition to the configuration described with reference to FIG. 15, each of the display modules 1002 and 1003 may further include a flattened layer 810 disposed on the second substrate 200. That is, a flattened layer 810 to cover the connection wire, the light emitting element 400, the connection electrode 300, and the exposed portion of the first electrode 120 may be formed on the top surface of the second substrate 200 on which the light emitting element 400 is arranged.

An optical film 840 such as a color filter may be disposed on the flattened layer 810. The optical film 840 may adjust the color of the pixel when the light emitting element 400 is turned on.

A protective layer 830 disposed at an edge side of the first substrate 100 and an end portion of the flattened layer 810 may be further provided. The protective layer 830 may protect the display structure when the display modules are bonded to each other.

A black matrix 820 may be disposed between the protective layer 830 and the edge side of the first substrate 100 and the end portion of the flattened layer 810. The black matrix 820 may improve the contrast of pixels.

As described above, the two display modules 1002 and 1003 may be bonded to each other on a bonding interface 800 such that the protective layers 830 faces each other. Thereby, a modular display may be configured.

Referring to FIG. 20, it may be seen that the protective layers 830, the black matrices 820, and the substrate bodies 110 of the first substrates 100 are disposed at a portion where the two modules 1002 and 1003 contact each other. In this case, as described above, the substrate body 110 is a PCB. In addition, it may be seen that electrode elements such as the connection electrode 310 are not directly or indirectly exposed on the contact surface.

Accordingly, when the modular display device is implemented, damage to the substrates 100 and 200 and the electrodes 120, 130, 140, 220, and 310 may be prevented.

In addition, when a high-resolution display device having pixels with a narrow pitch is manufactured, the connection electrode 310 may be locally configured using the exposure portion 500 (the through portion 530). Accordingly, a display with a narrow bezel, a so-called zero bezel display may be effectively manufactured. In addition, a space-efficient and design-efficient high-resolution display may be implemented. Therefore, a large-area high-resolution zero bezel display may be manufactured.

As described above, efficient wire connection may be implemented and damage to the electrodes and the substrates may be prevented. Accordingly, the reliability and quality of the display device may be improved.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

INDUSTRIAL APPLICABILITY

According to the present disclosure, a display device using a micro light emitting diode (LED) and a modular display device using the same may be provided.

The invention claimed is:

1. A display device comprising:

a first substrate including a first electrode disposed on a first surface, a second electrode disposed on a second surface opposite to the first surface, and a third electrode connecting the first electrode and the second electrode; wherein the first surface is positioned inside the first substrate, and the first electrode is disposed between a top surface of the first substrate and the first surface, a second substrate disposed on the first substrate and including a connection wire defining a plurality of individual pixel regions, wherein the second substrate is configured to form an exposure portion exposing at least a portion of the first electrode at an edge side of the first substrate;

a connection electrode contacting the exposed portion through a side surface of the second substrate to connect the first electrode of the first substrate and the connection wire of the second substrate; and a light emitting element connected to the connection wire of the second substrate, wherein the exposure portion includes a first exposure portion configured to expose an end portion of the first electrode and a second exposure portion configured to expose an end portion of a body of the first substrate.

2. The display device of claim 1, wherein the first substrate is a printed circuit board (PCB), and wherein the first electrode and the second electrode are electrodes printed on the PCB.

3. The display device of claim 1, wherein the second substrate is a thin film transistor (TFT) substrate having a TFT provided in the pixel regions.

4. The display device of claim 3, wherein the TFT has a drain electrode connected to the connection wire.

5. The display device of claim 1, wherein the third electrode connects the first electrode and the second electrode through the first substrate.

6. The display device according to claim 1, wherein the connection electrode comprises a protrusion disposed on the connection wire of the second substrate.

7. The display device according to claim 1, wherein a width of the second substrate is substantially equal to a width of the first substrate.

8. A modular display device having at least two display modules combined, the display module comprising:

a first substrate including a first electrode disposed on a first surface, a second electrode electrically connected to the first electrode and disposed on a second surface opposite to the first surface, and a third electrode connecting the first electrode and the second electrode;

a second substrate disposed on the first substrate and including a connection wire defining a plurality of individual pixel regions, wherein the second substrate is configured to form an exposure portion exposing at least a portion of the first electrode at an edge side of the first substrate;

a connection electrode contacting the exposed portion through a side surface of the second substrate to connect the first electrode of the first substrate and the connection wire of the second substrate to each other; and a light emitting element connected to the connection wire of the second substrate, wherein the exposure portion includes a first exposure portion configured to expose an end portion of the first electrode and a second exposure portion configured to expose an end portion of a body of the first substrate.

9. The modular display device according to claim 8, wherein the first substrate is a printed circuit board (PCB) substrate, and wherein the first electrode and the second electrode are electrodes printed on the PCB substrate.

10. The modular display device of claim 8, wherein the connection electrode comprises a protrusion disposed on the connection wire of the second substrate.

11. The modular display device of claim 8, wherein each of the display modules further comprises:

a flattened layer disposed on the second substrate; and a protective layer disposed at an edge side of the first substrate and at an end portion of the flattened layer.

12. The modular display device of claim 11, wherein two adjacent display modules among the at least two display modules are arranged to contact.

13. The modular display device of claim 12, wherein the protective layers of the two adjacent display modules are arranged to contact.

* * * * *